US008951862B2

(12) United States Patent
Chen et al.

(10) Patent No.: US 8,951,862 B2
(45) Date of Patent: Feb. 10, 2015

(54) DAMASCENE WORD LINE

(75) Inventors: Shih-Hung Chen, Hsinchu County (TW); Hang-Ting Lue, Hsinchu (TW); Yen-Hao Shih, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/347,331

(22) Filed: Jan. 10, 2012

(65) Prior Publication Data
US 2013/0175598 A1 Jul. 11, 2013

(51) Int. Cl.
*H01L 21/336* (2006.01)
(52) U.S. Cl.
USPC ...... 438/258; 365/185.01; 438/128; 257/324; 257/E21.645
(58) Field of Classification Search
CPC ............ H01L 27/11582; H01L 21/768; H01L 27/0688; H01L 27/11565; H01L 27/11578; H01L 29/7926; G11C 5/025
USPC ................... 365/185.28, 185.33, 230.06, 63, 365/185.01, 185.14, 185.05, 185.02, 365/185.17, 185.18; 257/324, E29.309, 257/E21.645; 438/258, 128
See application file for complete search history.

(56) References Cited

U.S. PATENT DOCUMENTS

| 6,531,359 | B1 | | 3/2003 | Tempel et al. | |
|---|---|---|---|---|---|
| 6,906,940 | B1 | * | 6/2005 | Lue | 365/63 |
| 7,005,350 | B2 | * | 2/2006 | Walker et al. | 438/268 |
| 8,199,576 | B2 | * | 6/2012 | Fasoli et al. | 365/185.13 |
| 2007/0253233 | A1 | * | 11/2007 | Mueller et al. | 365/51 |
| 2008/0106931 | A1 | * | 5/2008 | Toda | 365/163 |
| 2008/0285350 | A1 | * | 11/2008 | Yeh | 365/185.17 |
| 2009/0166723 | A1 | * | 7/2009 | Sung et al. | 257/328 |
| 2010/0226195 | A1 | * | 9/2010 | Lue | 365/230.06 |
| 2011/0095353 | A1 | * | 4/2011 | Lue | 257/324 |
| 2011/0149656 | A1 | * | 6/2011 | Tang et al. | 365/185.18 |
| 2012/0007167 | A1 | * | 1/2012 | Hung et al. | 257/324 |
| 2012/0051137 | A1 | * | 3/2012 | Hung et al. | 365/185.17 |
| 2012/0168849 | A1 | * | 7/2012 | Choi et al. | 257/324 |
| 2012/0181580 | A1 | * | 7/2012 | Lue et al. | 257/208 |
| 2012/0181599 | A1 | * | 7/2012 | Lung | 257/324 |
| 2012/0181654 | A1 | * | 7/2012 | Lue | 257/506 |
| 2012/0181684 | A1 | * | 7/2012 | Lue et al. | 257/734 |

(Continued)

FOREIGN PATENT DOCUMENTS

| KR | 20010056888 A | | 7/2001 | |
|---|---|---|---|---|
| KR | 2005-0011203 | * | 1/2005 | H01L 21/28 |
| KR | 20050011203 A | | 1/2005 | |

OTHER PUBLICATIONS

Yun et al., "Stacked-nanowire device with virtual source/drain (SD-VSD) for 3D NAND flash memory application", Solid-State Electronics, vol. 64, pp. 42-46 (Jul. 26, 2011).*

(Continued)

*Primary Examiner* — Marvin Payen
*Assistant Examiner* — Victor Barzykin
(74) *Attorney, Agent, or Firm* — Kenta Suzue; Haynes Beffel & Wolfeld LLP

(57) ABSTRACT

The technology relates to a damascene word line for a three dimensional array of nonvolatile memory cells. Conductive lines such as silicon are formed over stacked nonvolatile memory structures. Word line trenches separate neighboring ones of the silicon lines. The silicon lines separated by the word line trenches are oxidized, making insulating surfaces in the word line trenches. Word lines are made in the word line trenches.

15 Claims, 25 Drawing Sheets

(56) References Cited

U.S. PATENT DOCUMENTS

| | | | |
|---|---|---|---|
| 2012/0182801 A1* | 7/2012 | Lue | 365/185.05 |
| 2012/0182802 A1* | 7/2012 | Hung et al. | 365/185.11 |
| 2012/0182806 A1* | 7/2012 | Chen et al. | 365/185.17 |
| 2012/0182807 A1* | 7/2012 | Lue | 365/185.18 |
| 2012/0235224 A1* | 9/2012 | Yeh | 257/324 |
| 2012/0236642 A1* | 9/2012 | Lue | 365/185.05 |
| 2012/0327714 A1* | 12/2012 | Lue | 365/185.17 |
| 2013/0003434 A1* | 1/2013 | Lue et al. | 365/51 |

OTHER PUBLICATIONS

Yun et al., "Single-Crystalline Si STacked ARray (STAR)", IEEE Trans. Electron. Devices, vol. 58, pp. 1006-1014 (Apr. 2011).*
Paul et al., "Impact of a Process Variation on Nanowire and Nanotube Device Performance," IEEE Trans. on Electron Devices, vol. 54, No. 9, Sep. 2007, pp. 2369-2376.

* cited by examiner

US 8,951,862 B2

DAMASCENE WORD LINE

BACKGROUND OF THE INVENTION

1. Field of the Invention

The present invention relates to high density memory devices, and particularly to memory devices in which multiple planes of memory cells are arranged to provide a three-dimensional memory array.

2. Description of Related Art

In an example three-dimensional memory array, multiple ridges each include alternating stacks of semiconductor strips and oxide strips, and the ridges are covered by charge storage layers such as polysilicon or charge trapping material like ONO. Word lines orthogonal to and conformal to the ridges access the memory cells in the three-dimensional memory array. Insulating lines, such as oxide lines orthogonal to and conformal to the ridges, electrically isolate the neighboring word lines from each other.

However, it is not trivial to form the oxide lines between the word lines such that neighboring word lines are electrically isolated from each other by the oxide lines. FIGS. 1-2 show problems in various manufacturing processes for the word lines and the oxide lines of a three-dimensional memory array.

FIG. 1 is a perspective illustration of a three dimensional memory array device, where the polysilicon word lines are formed prior to the oxide lines separating the word lines, and polysilicon residue forms an undesirable bridge electrically connecting neighboring word lines.

Semiconductor strips 11, 13, 15 are separated by oxide strips 10, 12, 14, 16. The stacks of alternating semiconductor/oxide strips are covered by charge storage layers 26, such as ONO or ONONO. The polysilicon word line 55 is formed by covering the stacks of alternating semiconductor/oxide strips and charge storage layers with polysilicon, and etching away excess polysilicon between neighboring polysilicon word lines to form trenches between neighboring polysilicon word lines. After etching away the excess polysilicon, oxide lines are formed that isolate neighboring polysilicon word lines.

A high aspect ratio is presented by the height of the stacks of alternating semiconductor/oxide strips covered by charge storage layers, relative to the desired distance between neighboring word lines. As a result, there is a failure to etch away polysilicon residue 56. Despite the following oxide fill in the trenches formed by the polysilicon etch, the polysilicon residue 56 electrically connects neighboring word lines (the word line shown in the figure, and a neighboring word line not shown in the figure).

The charge storage layers fill part of the oxide void in the stack of alternating semiconductor/oxide strips, which is a region 27 of oxide pull-back. Oxide pull-back was caused by cleaning the stacks of alternating semiconductor/oxide strips, in preparation for making the charge storage layers. The region 27 of oxide pull-back in turn results in a void in the charge storage layers. This void is filled by polysilicon residue 57, which electrically connects neighboring word lines (the word line shown in the figure, and a neighboring word line not shown in the figure).

FIG. 2 is a perspective illustration of a three dimensional memory array device, where the oxide lines are formed prior to the polysilicon word lines, and an oxide void allows polysilicon residue to form an undesirable bridge electrically connecting neighboring word lines.

Semiconductor strips 11, 13, 15 are separated by oxide strips 10, 12, 14, 16. The stacks of alternating semiconductor/oxide strips are covered by charge storage layers, such as a charge storage structure of an oxide 20—nitride 21—oxide 22. The oxide line 45 is formed by covering the stacks of alternating semiconductor/oxide strips and charge storage layers with oxide, and etching away excess oxide between neighboring oxide lines to form trenches between neighboring oxide lines. After etching away the excess oxide, damascene polysilicon word lines are formed in the trenches between neighboring oxide lines.

Oxide line 45 has a void 46. In the step of making polysilicon word lines in the trenches between neighboring oxide lines, the oxide void 46 is filled with polysilicon, electrically connecting the neighboring polysilicon word lines on either side of the oxide line 45.

An additional problem is the quality of the charge storage layers covering the alternating stacks of semiconductor strips and oxide strips. When the charge storage layers are formed prior to the word lines and oxide lines, and the oxide lines are formed prior to the word lines, the oxide lines are formed by etching away excess oxide between the oxide lines to form trenches for the word lines. However, after the oxide etch removes excess oxide, the oxide etch damages the charge storage layers under the excess oxide. This damage to the charge storage layers harms memory device performance. For charge storage layers with an outer oxide such as ONO, it is difficult to selectively etch the excess oxide but not the outer oxide of the charge storage layers.

FIG. 3 is a top view of a three dimensional memory array device, where the ONO storage layers are formed after the oxide lines but prior to the polysilicon word lines, resulting in larger dimensions of the array. The process flow shows: (i) formation of the stacks of alternating oxide/semiconductor strips 18, (ii) formation of oxide lines 42 orthogonal and conformal to the oxide/semiconductor strips, and (iii) formation of charge storage layers 28 such as ONO or polysilicon. The charge storage layers can cover the stacks of alternating oxide/semiconductor strips 18. The figure does not show the charge storage layers can cover the stacks of alternating oxide/semiconductor strips 18, so that the lateral dimensions of the storage layers are visible. This process flow is disadvantageous, because the unit cell size is laterally enlarged by twice the thickness of the storage layers.

It is desirable to provide a structure for three-dimensional integrated circuit memory with a low manufacturing cost, including reliable, very small memory elements and improved process window associated with neighboring stacks of memory cell strings having gate structures.

SUMMARY OF THE INVENTION

Technology is described here that includes a method of making a three dimensional array of nonvolatile memory cells. Word line trenches are made over stacked nonvolatile memory structures in the three dimensional array, by forming silicon lines over the stacked nonvolatile memory structures such that the word line trenches separate neighboring ones of the silicon lines. Insulating surfaces are made in the word line trenches, by oxidizing the silicon lines separated by the word line trenches. Word lines are made in the word line trenches.

In some embodiments of the described technology, the silicon lines include at least one of amorphous silicon, polysilicon, and single crystal silicon.

In some embodiments of the described technology, forming the plurality of silicon lines leaves silicon residue in at least one of the of word line trenches. The silicon residue is oxidized, while oxidizing the silicon lines.

In some embodiments of the described technology, the silicon lines have voids that are filled with oxidized silicon, while oxidizing the plurality of silicon lines.

In some embodiments of the described technology, the silicon lines are formed, by making a layer of silicon over the stacked nonvolatile memory structures, and removing excess silicon from the layer to leave the silicon lines and form the word line trenches between neighboring ones of the silicon lines.

In some embodiments of the described technology, after oxidizing the silicon lines, exposed oxide is etched, that covers the stacked nonvolatile memory structures in the word line trenches. The exposed oxide can be etched until exposing a nitride layer covering the plurality of stacked nonvolatile memory structures. Oxide can be formed that covers the stacked nonvolatile memory structures in the word line trenches. The formed oxide can be from oxidizing the nitride layer covering the stacked nonvolatile memory structures to form an outer oxide covering the stacked nonvolatile memory structures in the word line trenches.

In some embodiments of the described technology, making the word lines is a damascene process.

In some embodiments of the described technology, prior to making the word line trenches, the stacked nonvolatile memory structures are formed, including semiconductor strips separated by insulating material, and charge storage structures covering the semiconductor strips. The charge storage structures can include a silicon nitride layer. Also, the charge storage structures including an oxide-nitride-oxide-nitride-oxide structure (such as BE-SONOS). In one example, the charge storage structures include a hafnium oxide layer. In yet another example, charge storage structures covering the plurality of semiconductor strips, the charge storage structures include a dielectric layer having a dielectric constant greater than a silicon oxide dielectric constant, also called a high-K layer.

Various other embodiments of the described technology are disclosed herein.

A modification to the described technology above, replaces the silicon lines separated by word line trenches, with material lines that are separated by word line trenches. Insulating surfaces are made in the word line trenches, by oxidizing the material lines separated by the word line trenches. Example material lines are metal lines such as W which oxidizes to WOx. Successful oxidation of a metal line to an insulating oxide is process dependent, and varies with the oxygen concentration.

Various other embodiments of the described technology are disclosed herein.

In another technology described herein, word lines are made in word line trenches over stacked nonvolatile memory structures in the three dimensional array. Word line trenches separate neighboring ones of oxide lines over the stacked nonvolatile memory structures. Word lines include a first set of silicon members between neighboring ones of the stacked nonvolatile memory structures.

In some embodiments of the described technology, the word lines are made by filling the word line trenches with silicon. Part of the silicon word lines is etched to make metal trenches in the silicon word lines. The silicon word lines can be etched until exposing the expose charge storage structures covering the stacked nonvolatile memory structures, or without exposing charge storage structures covering the stacked nonvolatile memory structures. The metal trenches are filled with metal to form metal surfaces of the silicon word lines.

In some embodiments of the described technology, a metal silicide is formed on the word lines.

In some embodiments of the described technology, making the plurality of word lines is a damascene process.

In some embodiments of the described technology, the word lines include a second set of silicon members orthogonal to the first set of silicon members.

In another technology described herein, an integrated circuit with a three dimensional array of nonvolatile memory cells, includes word lines, oxide lines separating neighboring ones of the word lines, and stacked nonvolatile memory structures in the three dimensional array.

The stacked nonvolatile memory structures are covered by the plurality of word lines and the oxide lines. The stacked nonvolatile memory structures include a nitride layer. The stacked nonvolatile memory structures include a first part covered by the word lines and a second part covered by the oxide lines. The nitride layer in the first part has a narrower thickness than the nitride layer in the second part.

In some embodiments of the described technology, the nitride layer is a charge storage layer of the nonvolatile memory cells.

Other aspects and advantages of the present invention can be seen on review of the drawings, the detailed description and the claims, which follow.

DETAILED DESCRIPTION

Figure 4:
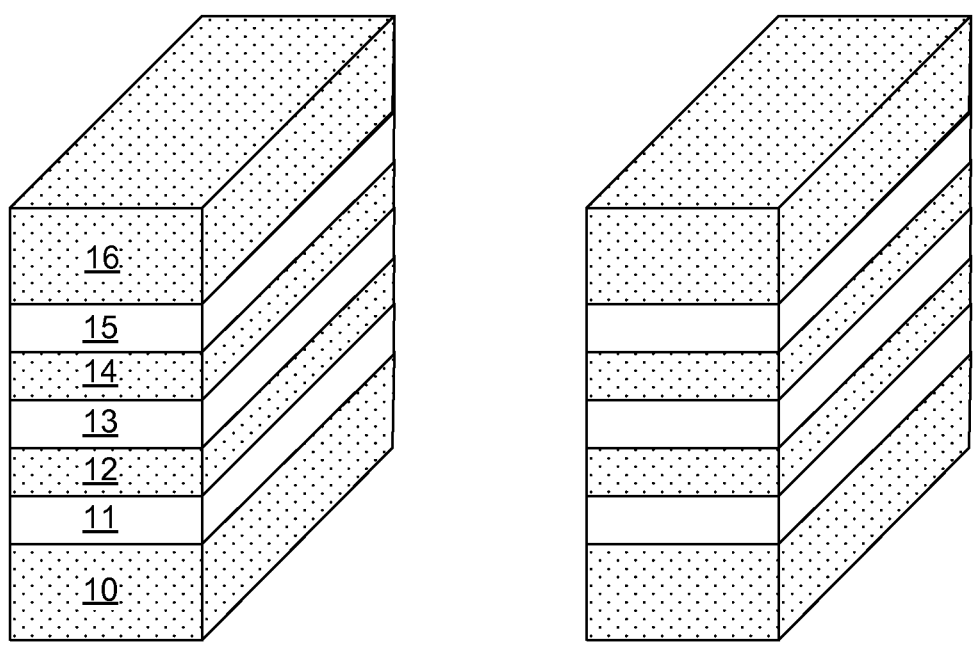
FIG. 4 illustrates part of a process for manufacturing a memory device, and shows a perspective illustration of forming a plurality of parallel semiconductor strips separated by oxide strips, arranged in a plurality of ridge-shaped stacks.

FIG. 4 illustrates part of a process for manufacturing a memory device, and shows a perspective illustration of forming a plurality of parallel semiconductor strips separated by oxide strips, arranged in a plurality of ridge-shaped stacks.

In FIG. 4, only 3 layers of semiconductor strips are shown for purposes of illustration. However, the number of layers can be extended to other numbers such as 2 layers, 4 layers, 8 layers, 16 layers, or another number of layers. The memory array is formed on an integrated circuit substrate having an insulating layer over underlying semiconductor or other structures (not shown). The memory array includes a plurality of stacks (2 stacks are shown in the figure) of semiconductor strips 11, 13, 15 alternating with insulating material strips 10, 12, 14, 16. The stacks are ridge-shaped extending on the Y-axis as illustrated in the figure, so that the semiconductor strips 11, 13, 15 can be configured as memory cell strings. Semiconductor strips at the same height can act as memory cell strings in a same memory plane.

To make the stacks of strips, in one example semiconductor layers alternating with insulating material layers are formed for example in blanket deposition in the array area of the chip. The semiconductor strips are implemented using the semiconductor layers separated by the insulating layers. FIG. 4 shows the result of a lithographic patterning step used to define a plurality of ridge-shaped stacks of semiconductor strips. Deep, high aspect ratio gaps can be formed between the stacks, supporting many layers, using lithography based processes applying a carbon hard mask and reactive ion etching.

The semiconductor strips 11, 13, 15 can be a p-type semiconductor material. For example, the semiconductor strips can be made using p-type polysilicon, or p-type epitaxial single crystal silicon.

Alternatively, the semiconductor strips 11, 13, 15 can be n-type semiconductor material. An n-type strip arrangement can result in buried-channel, depletion mode charge trapping memory cells. For example, the semiconductor strips 11, 13, 15 can be made using n-type polysilicon, or n-type epitaxial single crystal silicon. A typical doping concentration for n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NAND strings and thereby allowing higher read current.

Inter-level insulating strips 10, 12, 14, 16 can be implemented for example using silicon dioxide, other silicon oxides, or silicon nitride. These layers can be formed in a variety of ways, including low pressure chemical vapor deposition LPCVD processes.

The insulating material 12 between the semiconductor strips 11 and 13, and the insulating material 14 between semiconductor strips 13 and 15, and the insulating material in corresponding insulating material strips in other stacks, has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers of semiconductor strips.

Figure 5:
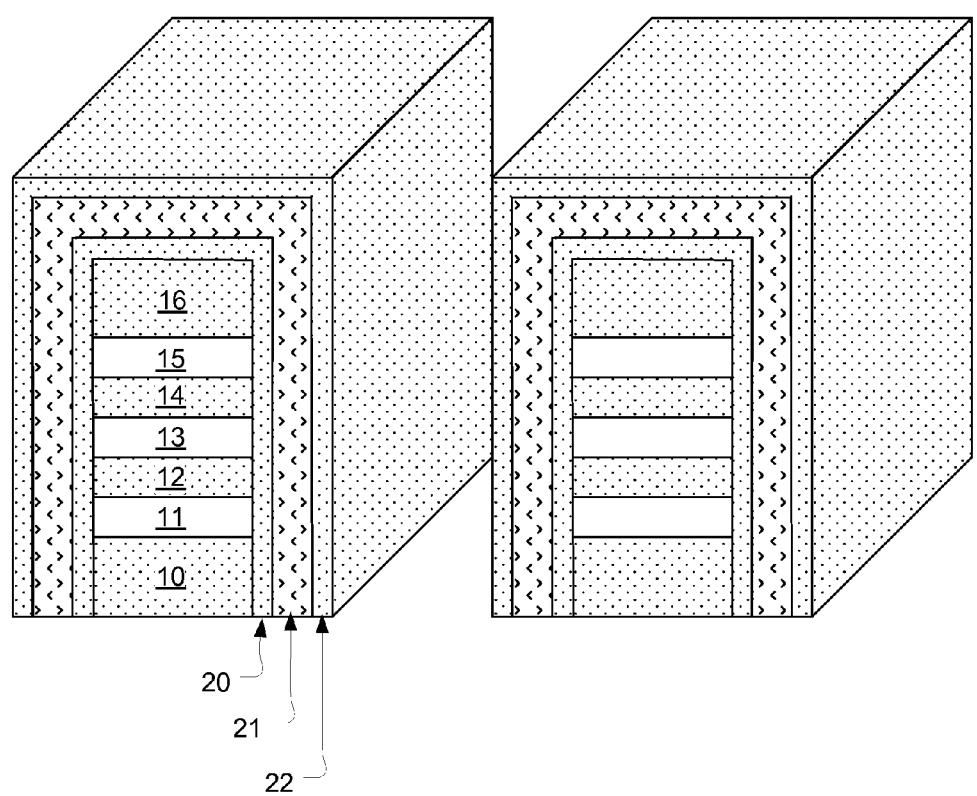
FIG. 5 illustrates part of a process for manufacturing a memory device, and is a perspective illustration of forming oxide-nitride-oxide data storage layers on the plurality of ridge-shaped stacks of FIG. 4.

FIG. 5 illustrates part of a process for manufacturing a memory device, and is a perspective illustration of forming oxide-nitride-oxide data storage layers on the plurality of ridge-shaped stacks of FIG. 4.

The data storage layers can include a dielectric charge trapping structure. Shown are the results of blanket deposition of data storage layers oxide 22 (isolation layer)—nitride 21 (band offset layer)—oxide 20 (hole tunneling layer), which conformally coat the plurality of stacks of semiconductor strips in this example.

The layer(s) of memory material can comprise other charge storage structures. For example, a bandgap engineered SONOS (BE-SONOS) charge storage structure can be used which includes a dielectric tunneling layer that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and NH$_3$ precursors at 680° C. In alternative processes, the band offset layer comprises silicon oxynitride, made using a similar process with an N$_2$O precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level is such that an electric field sufficient to induce hole tunneling through the thin region at the interface with the semiconductor body, is also sufficient to raise the valence band energy level to a level that effectively eliminates the hole tunneling barrier in the composite tunneling dielectric. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD SiO$_2$. Other blocking dielectrics can include high-κ materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material can be p+ polysilicon (work function about 5.1 eV) used in the word line 50 shown in later figures.

The outer oxide 22 in FIG. 5 is a sacrificial oxide, to be removed and regrown later.

Figure 6:
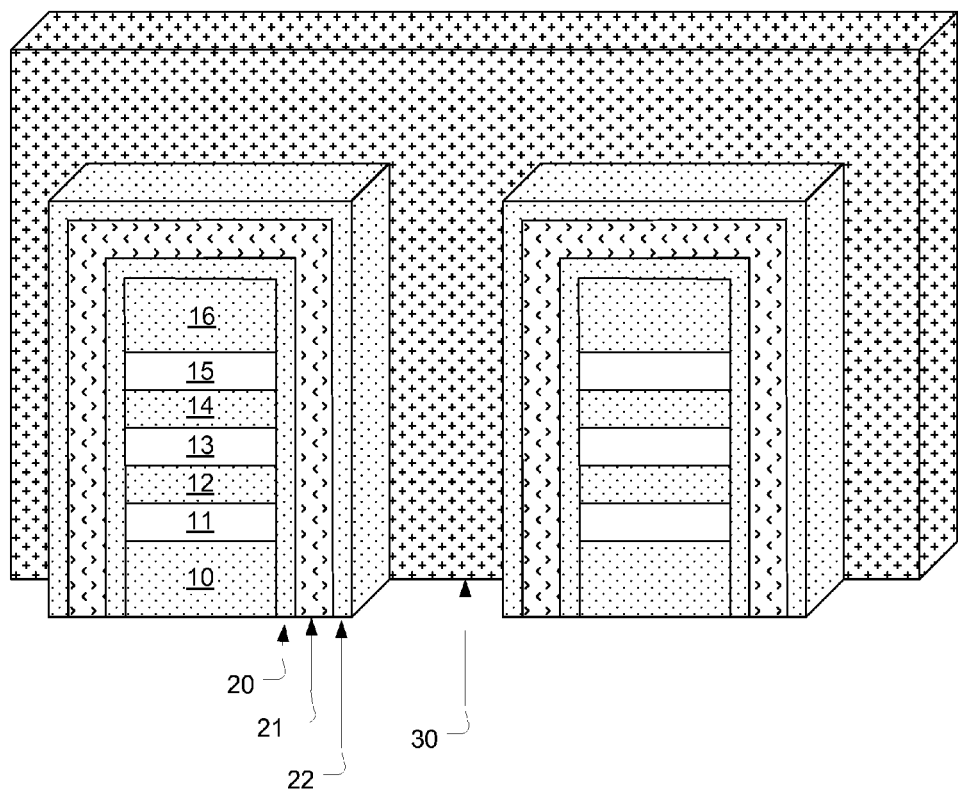
FIG. 6 illustrates part of a process for manufacturing a memory device, and is a perspective illustration of forming polysilicon lines with conformal bottom surfaces arranged over the plurality of ridge-shaped stacks of FIG. 5.

FIG. 6 illustrates part of a process for manufacturing a memory device, and is a perspective illustration of forming polysilicon lines with conformal bottom surfaces arranged over the plurality of ridge-shaped stacks of FIG. 5.

Figure 22:
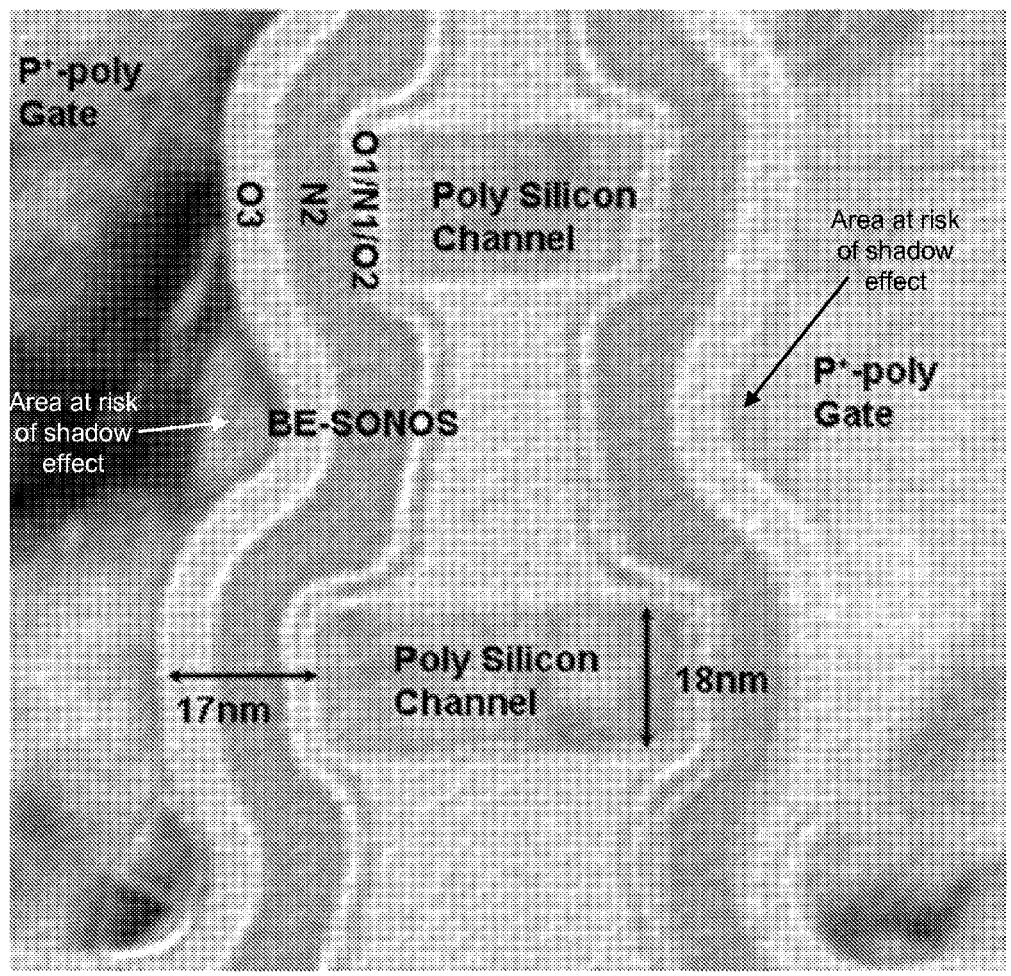
FIG. 22 is a picture of a cross-section of part of a 3D memory with a stack of alternating channels and oxides, illustrating areas of potential "shadow effect".

The preceding discussion is applicable to FIG. 22.

The polysilicon line 30 is formed conformally over the data storage layers covering the plurality of stacks of semiconductor strips. The polysilicon line 30 fills the gaps between the plurality of stacks of semiconductor strips. One polysilicon line 30 is shown, but other embodiments have a plurality of polysilicon lines. Additional polysilicon lines are formed along the y-axis out of the page and into the page. Neighboring polysilicon lines are separated by a word line trench.

In a high aspect ratio fill step, conductive material, such as polysilicon having n-type or p-type doping, is deposited to cover the stacks of semiconductor material strips and fill the gaps between the stacks of semiconductor material strips. High aspect ratio deposition technologies such as low-pressure chemical vapor deposition of polysilicon is utilized to completely fill the gaps 220 between the ridge-shaped stacks, even very narrow trenches on the order of 10 nanometers wide with high aspect ratio.

Figure 13:
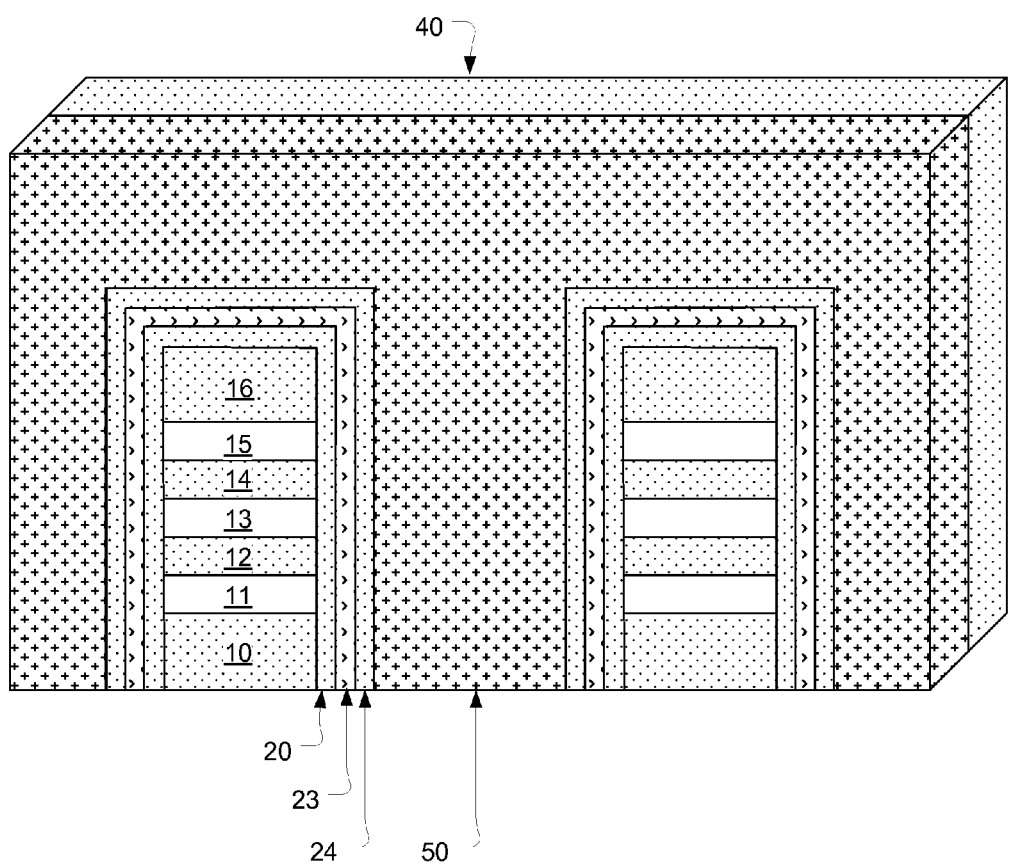
FIG. 13 illustrates part of a process for manufacturing a memory device, and is a perspective illustration of forming polysilicon word lines in the trenches between the oxide lines with conformal bottom surfaces arranged over the plurality of ridge-shaped stacks of FIG. 12.

In a lithographic patterning step, the polysilicon line 30 is defined. The lithographic patterning step utilizes a mask for critical dimensions of the array for etching high aspect ratio trenches between the polysilicon lines, without etching through the ridge-shaped stacks. The high aspect ratio word line trenches separate the polysilicon lines formed in this step, and define where the word lines will be formed in a future step such as shown in FIG. 13. Polysilicon can be etched using an etch process that is highly selective for polysilicon over silicon oxides or silicon nitrides. Thus, alternating etch processes are used, relying on the same mask to etch through the conductor and insulating layers, with the process stopping on an underlying insulating layer.

Figure 7:
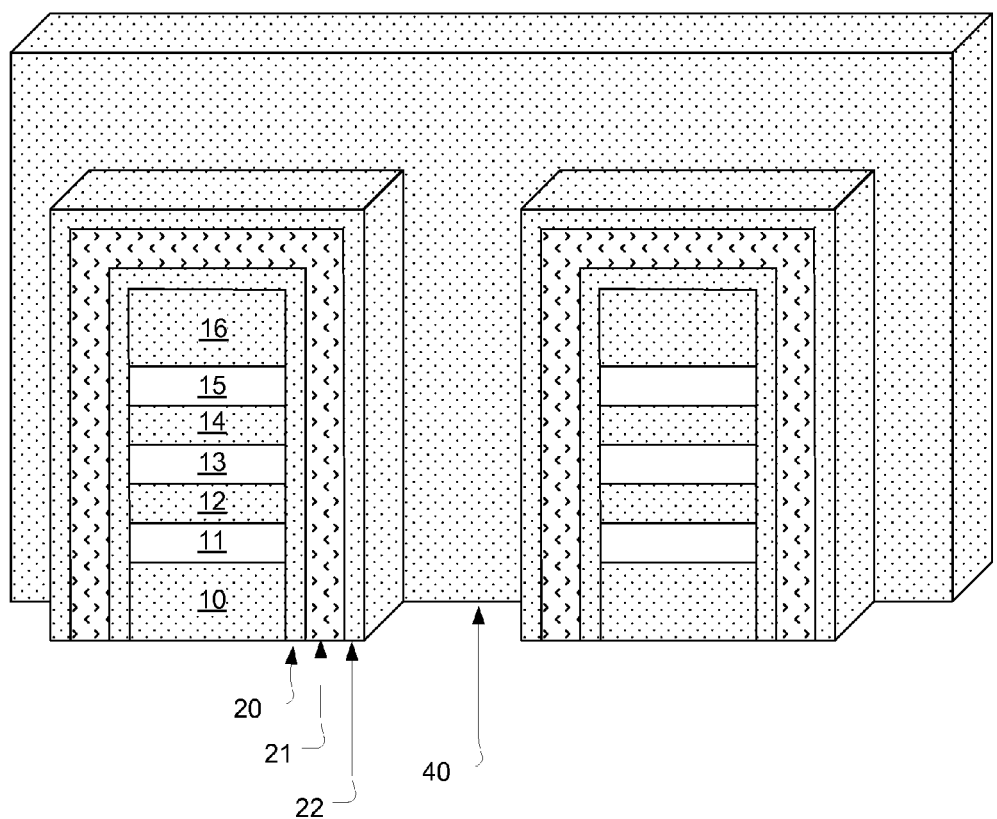
FIG. 7 illustrates part of a process for manufacturing a memory device, and is a perspective illustration of forming oxide lines with conformal bottom surfaces arranged over the plurality of ridge-shaped stacks, from the conformal polysilicon lines of FIG. 6.

FIG. 7 illustrates part of a process for manufacturing a memory device, and is a perspective illustration of forming oxide lines with conformal bottom surfaces arranged over the plurality of ridge-shaped stacks, from the conformal polysilicon lines of FIG. 6.

The conformal polysilicon line 30 is oxidized to form oxide line 40. Oxide line 40 is conformal over the data storage layers covering the plurality of stacks of semiconductor strips, and fills the trenches defined by the plurality of stacks of semiconductor strips. One oxide line 40 is shown, but other embodiments have a plurality of oxide lines. Additional oxide lines are formed along the y-axis out of the page and into the page. Neighboring oxide lines are separated by a word line trench.

The oxidation process of FIG. 7 addresses issues with polysilicon voids and polysilicon residue, as shown in the following figures. The amount of material in the polysilicon line is a limiting source on the oxidation process. In the reaction, Si (from the polysilicon line)+$O_2$ forms $SiO_2$. The volume of the resulting $SiO_2$ expands by over 120% over the reacted Si source. Adding volume figures where the resulting $SiO_2$ has a volume of 100%, Si (solid, volume 45%)+$O_2$ (gas) forms $SiO_2$ (Solid, volume 100%). So the volume expansion of silicon to silicon oxide is 55/45 or about 122% due to oxidation. As a result, small voids in the polysilicon are filled in the oxidation process.

Over-oxidation is performed to ensure that the polysilicon is oxidized, for example 100% over-oxidation. The following example illustrates over-oxidation. With an unlimited Si source, in one example if Si+O2 (under 1000 C/30 min) forms 100 angstroms of $SiO_2$. In the same environment, if time is increase to 4×30 min to 120 min), the process forms 200 angstroms of $SiO_2$. If the Si source is only enough for 100 angstroms of $SiO_2$, then oxidation in this environment for 120 min is 100% over oxidation.

Figure 8:
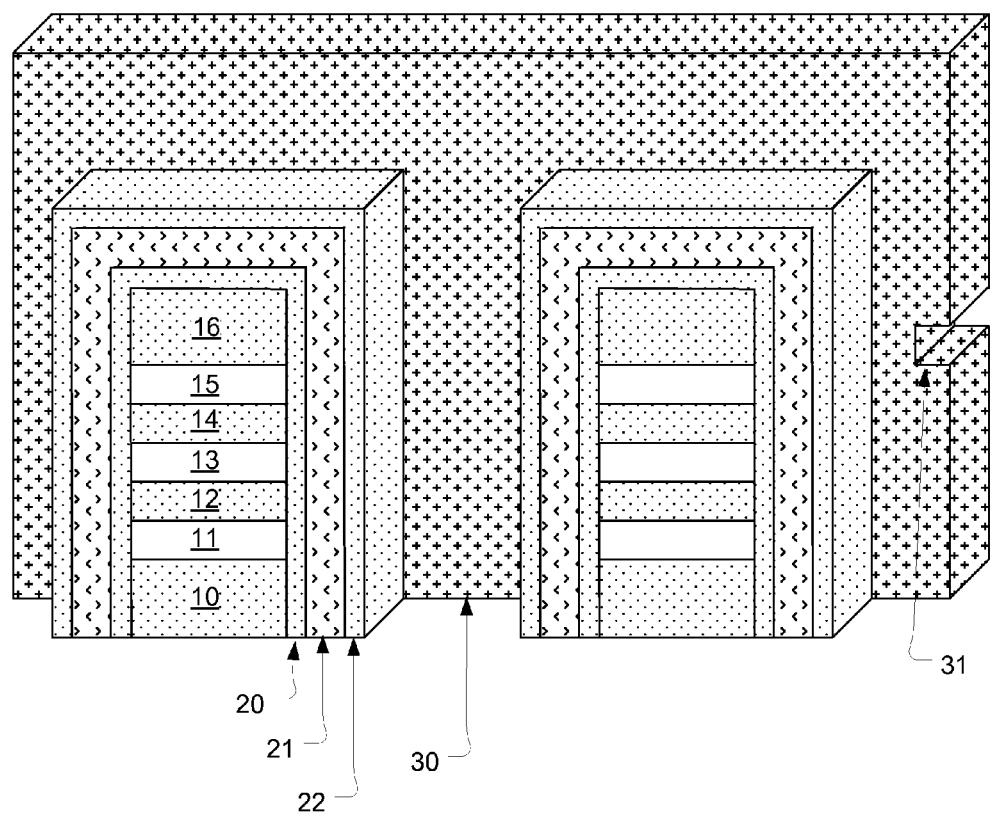
FIG. 8 is an alternative of FIG. 6, illustrating part of a process for manufacturing a memory device, and is a perspective illustration of forming polysilicon lines with conformal bottom surfaces arranged over the plurality of ridge-shaped stacks of FIG. 5, with a void in a polysilicon line.

FIG. 8 is an alternative of FIG. 6, illustrating part of a process for manufacturing a memory device, and is a perspective illustration of forming polysilicon lines with conformal bottom surfaces arranged over the plurality of ridge-shaped stacks of FIG. 5, with a void in a polysilicon line.

As discussed above in connection with FIG. 7, the void 31 becomes filled with silicon oxide during the process of oxidizing the polysilicon line 30. After oxidation and expansion of silicon oxide into the void 31, the result is removal of the void as in FIG. 7. If the void was not removed, then there would be a risk of filling the void with a conductive bridge electrically connecting neighboring word lines.

Figure 9:
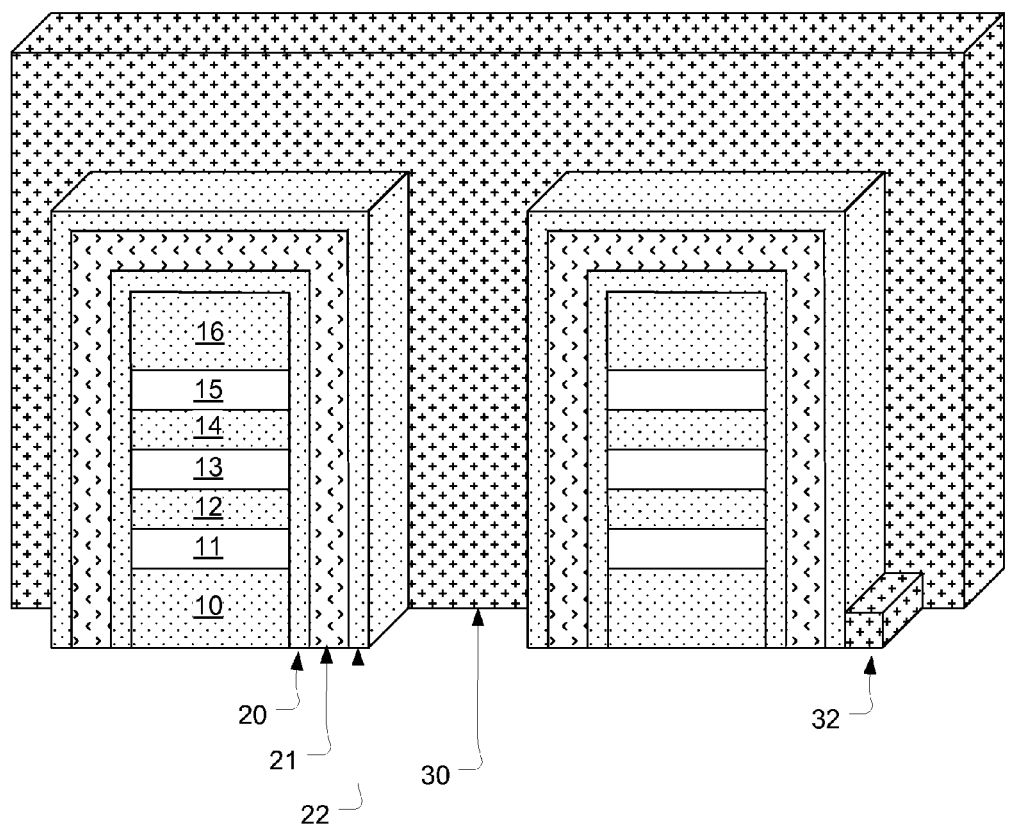
FIG. 9 is an alternative of FIG. 6, illustrating part of a process for manufacturing a memory device, and is a perspective illustration of forming polysilicon lines with conformal bottom surfaces arranged over the plurality of ridge-shaped stacks of FIG. 5, with polysilicon residue adjacent to a polysilicon line.

FIG. 9 is an alternative of FIG. 6, illustrating part of a process for manufacturing a memory device, and is a perspective illustration of forming polysilicon lines with conformal bottom surfaces arranged over the plurality of ridge-shaped stacks of FIG. 5, with polysilicon residue adjacent to a polysilicon line.

As discussed above, the polysilicon residue 32 creates a risk forming a conductive bridge electrically connecting neighboring word lines. The polysilicon residue 32 is addressed in connection with FIG. 10.

Figure 10:
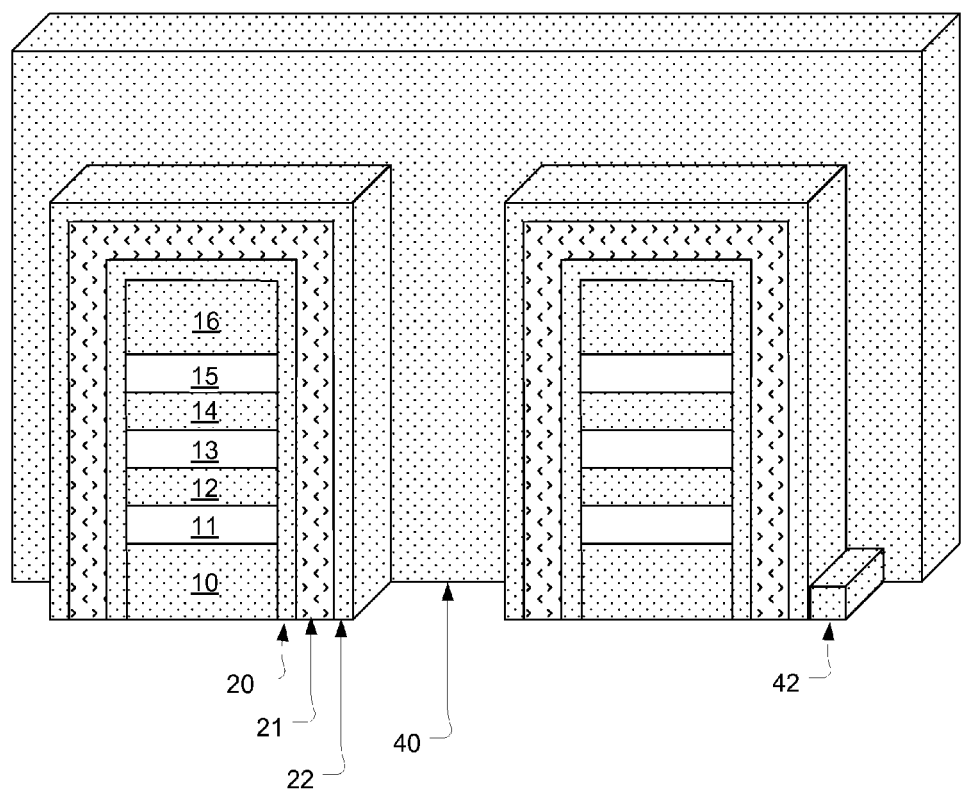
FIG. 10 is an alternative of FIG. 7, illustrating part of a process for manufacturing a memory device, and is a perspective illustration of forming oxide lines with conformal bottom surfaces arranged over the plurality of ridge-shaped stacks, from the conformal polysilicon lines of FIG. 9, and shows that the polysilicon residue is formed into oxide residue.

FIG. 10 is an alternative of FIG. 7, illustrating part of a process for manufacturing a memory device, and is a perspective illustration of forming oxide lines with conformal bottom surfaces arranged over the plurality of ridge-shaped stacks, from the conformal polysilicon lines of FIG. 9, and shows that the polysilicon residue is formed into oxide residue.

As discussed above in connection with FIG. 7, the polysilicon residue 32 is oxidized into silicon oxide 42 during the process of oxidizing the polysilicon line 30. This occurs during oxidation of the polysilicon line 30 into oxide line 40. If the polysilicon residue 32 was not oxidized, then there would be a risk of a conductive bridge electrically connecting neighboring word lines.

Figure 11:
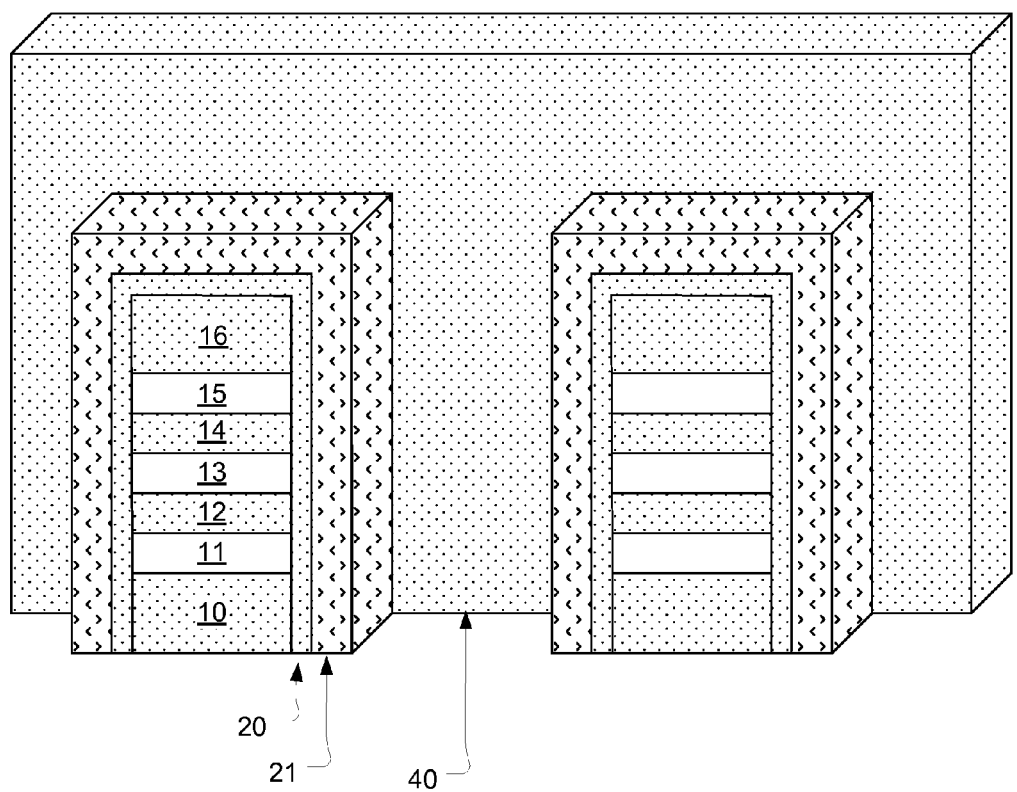
FIG. 11 is an alternative of FIG. 6, illustrating part of a process for manufacturing a memory device, and is a perspective illustration of removing the outer oxide from the oxide-nitride-oxide data storage layers of FIG. 7.

FIG. 11 is an alternative of FIG. 6, illustrating part of a process for manufacturing a memory device, and is a perspective illustration of removing the outer oxide from the oxide-nitride-oxide data storage layers of FIG. 7.

The sacrificial outer oxide may have been damaged during the lithographic patterning of polysilicon line 30 in connection with FIG. 6, as the etching process reached the sacrificial outer oxide.

The sacrificial outer oxide is removed from the data storage layers covering the plurality of ridge-shaped stacks. For example, HF base solution, is a selective etch with a high $SiO_2$ etch rate, and very low SiN etch rate. Due to the selective etch, not much SiN will be lost despite over etch of the $SiO_2$. Example over etch ranges are 20-50%. For example, if the oxide thickness to be removed is 100 angstroms, and HF etch rate is 100 angstroms/10 min, then dipping in HF for 12 min is a 20% over etch. The extra etch time is 12 minutes–10 minutes=2 minutes, and (2 minutes/10 minutes)=20% over etch. Another selective etch is $NH_4OH$. After removing the outer oxide layer 22, the nitride layer 21 is exposed.

Figure 12:
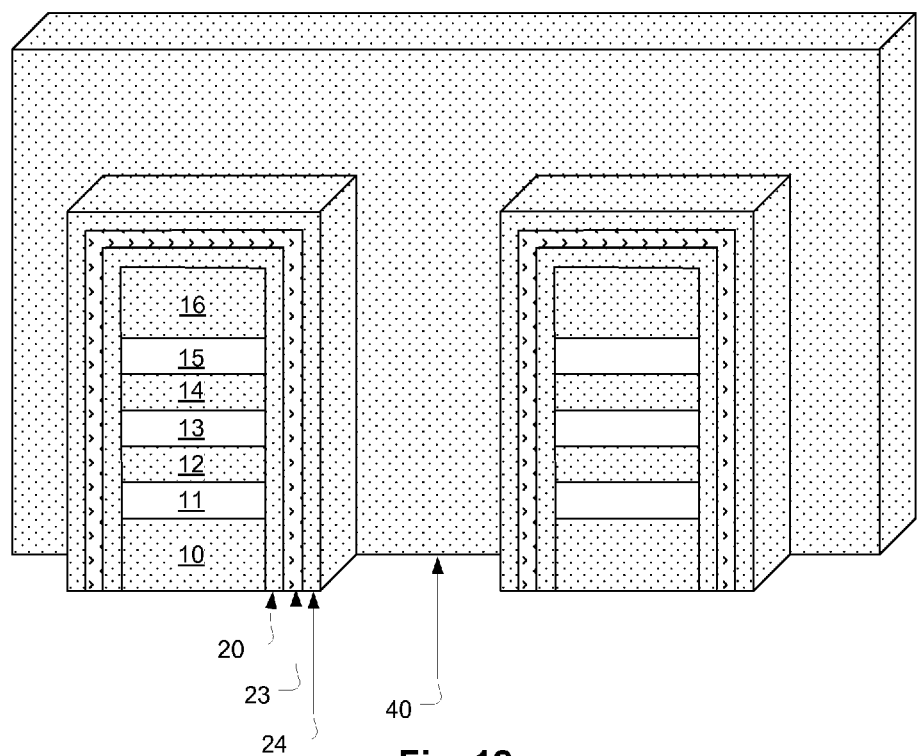
FIG. 12 illustrates part of a process for manufacturing a memory device, and is a perspective illustration of forming the outer oxide on the nitride-oxide data storage layers of FIG. 11.

FIG. 12 illustrates part of a process for manufacturing a memory device, and is a perspective illustration of forming the outer oxide on the nitride-oxide data storage layers of FIG. 11.

In the oxidation, SiN+$O_2$ (high temp) forms SiO2(solid)+$N_2$ (gas). Example high temperature of 1200 deg C. to oxidize SiN is higher than the example high temperature of 900 deg C. to oxidize Si. A strong oxidant such as Off and $O_2$ oxygen atoms help oxidize SiN.

In this self-aligned process, $SiO_2$ is formed from the SiN in the word line trenches between neighboring oxide lines. Part of nitride layer 21 is consumed to leave a thinner nitride layer 23, and the regrown oxide layer 24.

FIG. 13 illustrates part of a process for manufacturing a memory device, and is a perspective illustration of forming polysilicon word lines in the trenches between the oxide lines with conformal bottom surfaces arranged over the plurality of ridge-shaped stacks of FIG. 12.

Figure 1:
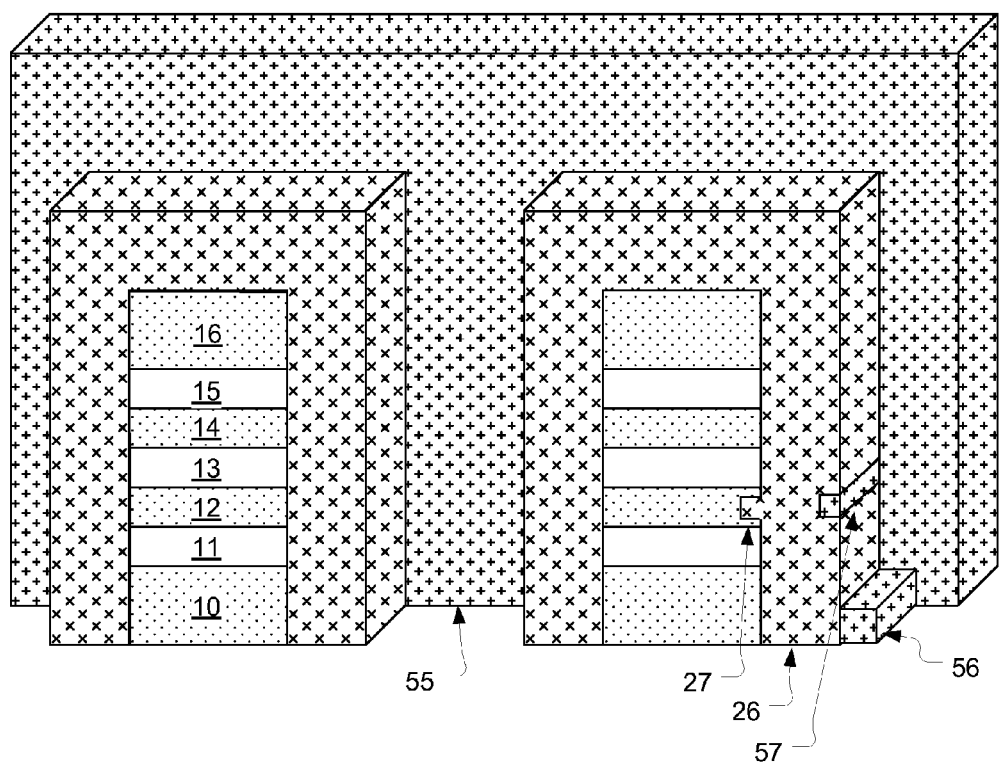
FIG. 1 is a perspective illustration of a three dimensional memory array device, where the polysilicon word lines are formed prior to the oxide lines separating the word lines, and polysilicon residue forms an undesirable bridge electrically connecting neighboring word lines.
Figure 2:
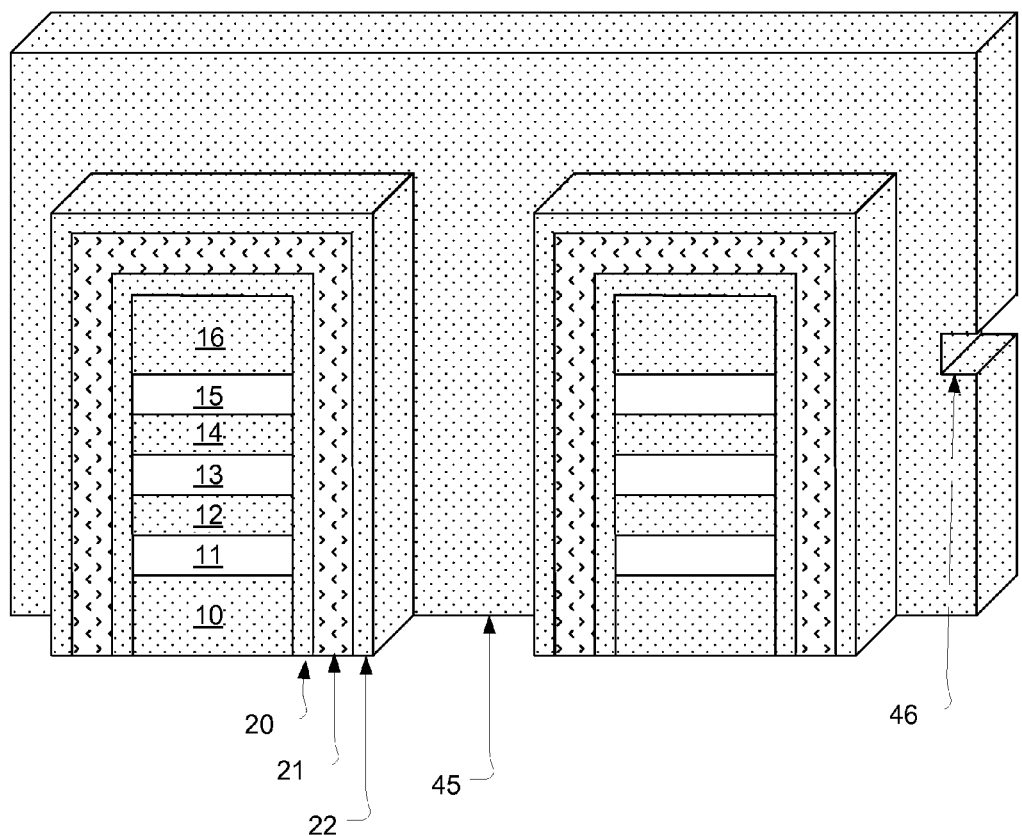
FIG. 2 is a perspective illustration of a three dimensional memory array device, where the oxide lines are formed prior to the polysilicon word lines, and an oxide void allows polysilicon residue to form an undesirable bridge electrically connecting neighboring word lines.
Figure 3:
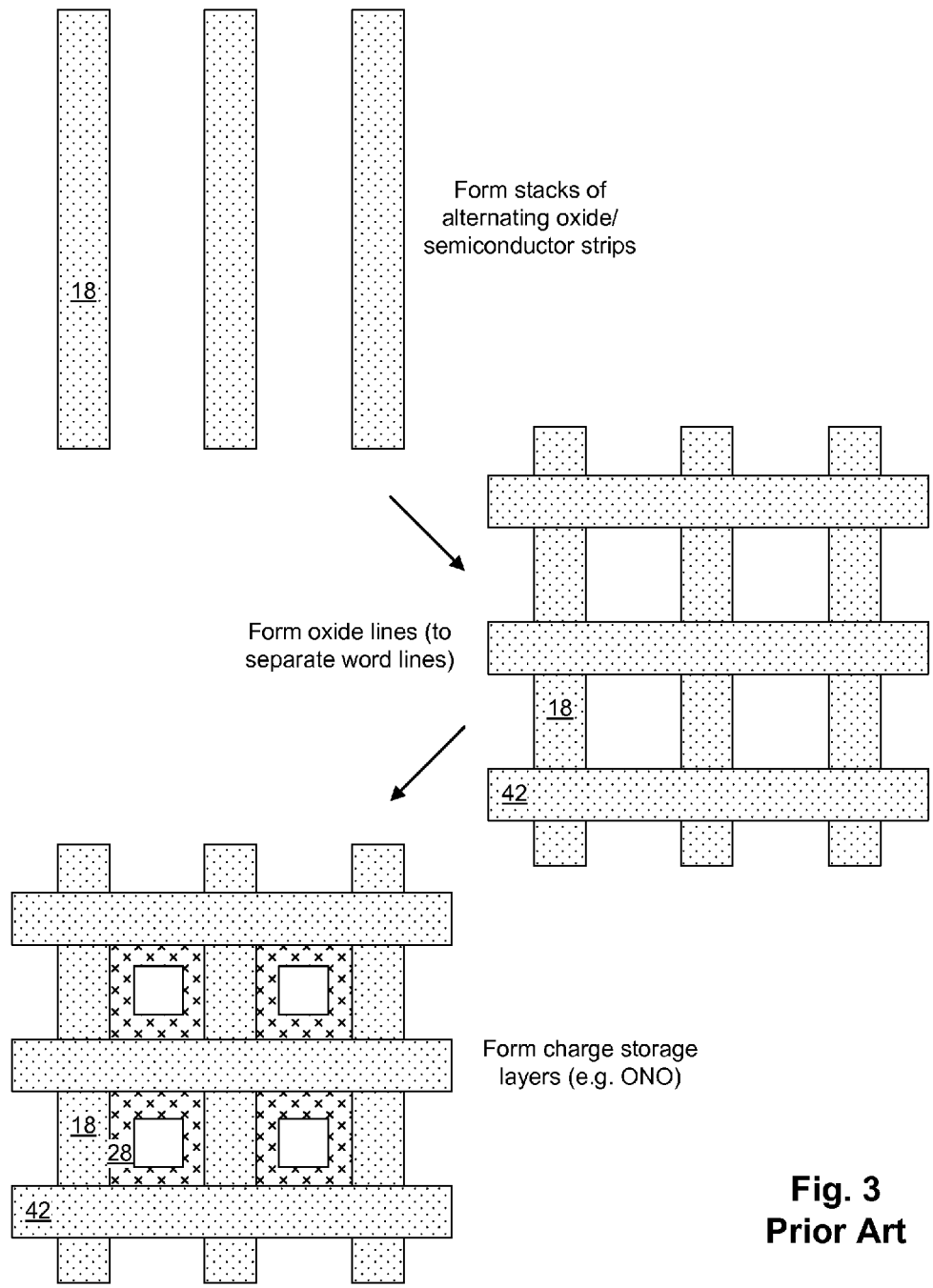
FIG. 3 is a top view of a three dimensional memory array device, where the ONO storage layers are formed after the oxide lines but prior to the polysilicon word lines, resulting in larger dimensions of the array.

The polysilicon word line 50 is formed conformally over the data storage layers covering the plurality of stacks of semiconductor strips. The polysilicon word line 50 fills the trenches defined by the plurality of stacks of semiconductor strips. One polysilicon word line 50 is shown, but other embodiments have a plurality of polysilicon word lines. Additional polysilicon word lines are formed along the y-axis out of the page and into the page. Neighboring polysilicon word lines are separated by an oxide line. This is a damascene process, as the polysilicon word lines fill previously defined trenches, such as the trenches formed between neighboring oxide lines as formed in FIG. 7. Excess polysilicon is etched back, or otherwise removed such as by CMP (Chemical Mechanical Polishing/Planarization). The polysilicon word line defines a multi-layer array of interface regions at crosspoints between side surfaces of the semiconductor strips 11, 13, 15 on the stacks and the polysilicon word line 50. The damascene process is an alternative to subtractive interconnect structures, such as in FIG. 1 where the deposited polysilicon word lines are patterned by etching.

The word line 50 can be a semiconductor material with the same or a different conductivity type as the semiconductor strips 11, 13, 15 (e.g. heavily doped p+-type polysilicon).

Memory cells comprising field effect transistors having charge storage structures are formed in the 3D array of crosspoints. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity ($10^{12}$) in a single chip.

In one embodiment charge trapping memory cells are formed at the intersection of word line 50 and semiconductor strips 11, 13, 15. Active charge trapping regions are formed on the both sides of the strip semiconductor strips 11, 13, 15, between the word line 50 and the semiconductor strips 11, 13, 15. In the embodiment described here, each memory cell is a double gate field effect transistor having active charge storage regions, one on each side of the semiconductor strip. Electron current flows along the semiconductor strips, to sense amplifiers where it can be measured to indicate the state of a selected memory cell.

The source/drain regions on either side of the word line 50 along the semiconductor strips can be "junction-free", without source and drain doping having a conductivity type opposite that of the channel regions along the semiconductor strips beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor strips 11, 13, 15 can be implemented using a lightly doped n-type semiconductor body in junction free arrangements, resulting in a buried-channel field effect transistor which can operate in depletion mode, with naturally shifted lower threshold distributions for the charge trapping cells.

After an interlayer dielectric is formed over the top of the array, vias are opened in which contact plugs, using tungsten fill for example, are formed reaching to the top surfaces of the gate structures. Overlying metal lines are patterned to connect as SSL lines, to column decoder circuits. A three-plane decoding network is established, accessing a selected cell using one word line, one bit line and one SSL line. See, U.S. Pat. No. 6,906,940, entitled Plane Decoding Method and Device for Three Dimensional Memories.

As a result, a 3D array of SONOS-type memory cells configured in a NAND flash array can be formed. The source, drain and channel are formed in the silicon (S) semiconductor strips, the layer of the memory material includes a tunneling dielectric layer which can be formed of silicon oxide (O), a charge storage layer which can be formed of silicon nitride (N), a blocking dielectric layer which can be formed of silicon oxide (O), and the gate comprises polysilicon (S) of the word lines.

In other embodiments, the NAND memory cells are replaced by other types of memory cells. For example, manowire MOSFET type cells can also be configured in this manner, by providing nanowire or nanotube structures in channel regions on word lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

Figure 14:
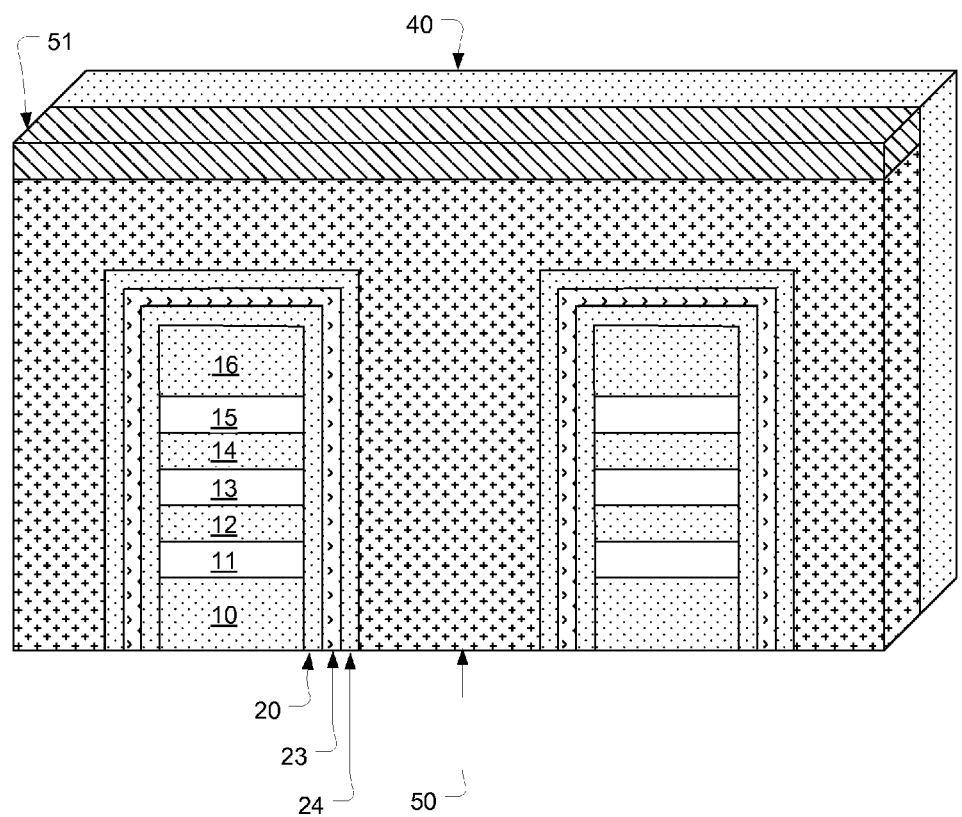
FIG. 14 illustrates part of a process for manufacturing a memory device, and is a perspective illustration of forming silicided polysilicon word lines from the polysilicon word lines of FIG. 13.

FIG. 14 illustrates part of a process for manufacturing a memory device, and is a perspective illustration of forming silicided polysilicon word lines from the polysilicon word lines of FIG. 13.

A layer of silicide (e.g. tungsten silicide, cobalt silicide, titanium silicide) 51 can be formed over the top surface of the word line 50. Deposition is followed by RTP (Rapid Thermal Processing).

Figure 15:
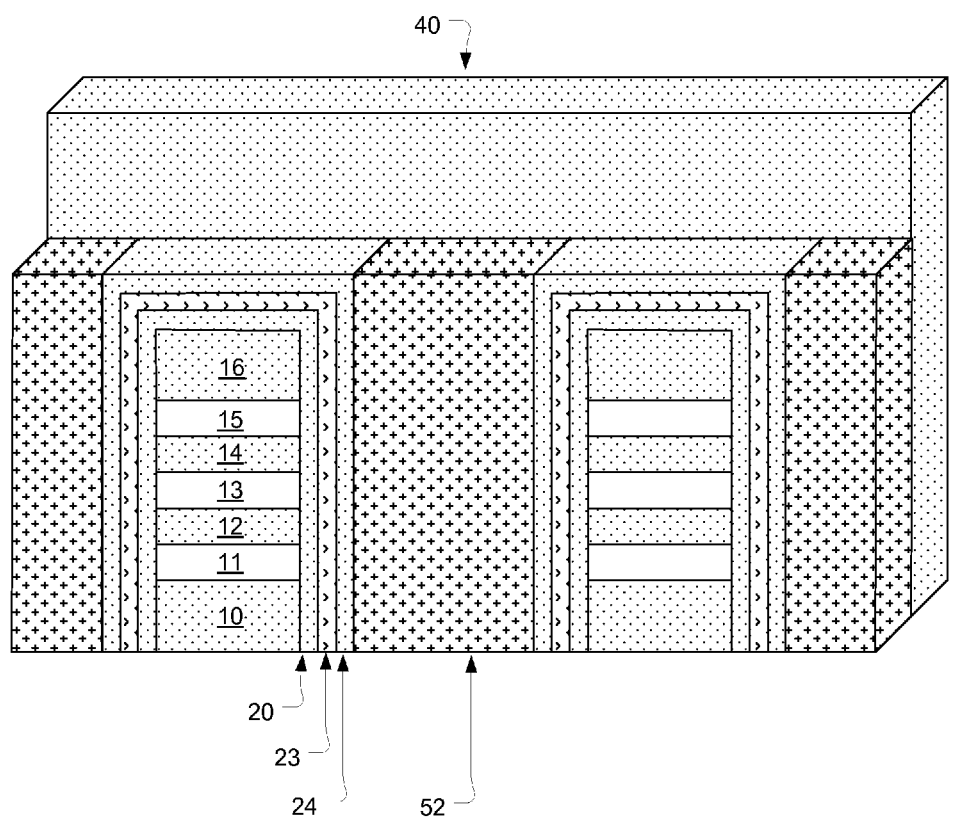
FIG. 15 is an alternative of FIG. 14, illustrating part of a process for manufacturing a memory device, and is a perspective illustration of removing polysilicon above the oxide-nitride-oxide data storage layers on the plurality of ridge-shaped stacks of FIG. 13.

FIG. 15 is an alternative of FIG. 14, illustrating part of a process for manufacturing a memory device, and is a perspective illustration of removing polysilicon above the oxide-nitride-oxide data storage layers on the plurality of ridge-shaped stacks of FIG. 13. After removal, vertical polysilicon members 52 remain on the sides of the plurality of ridges.

Figure 16:
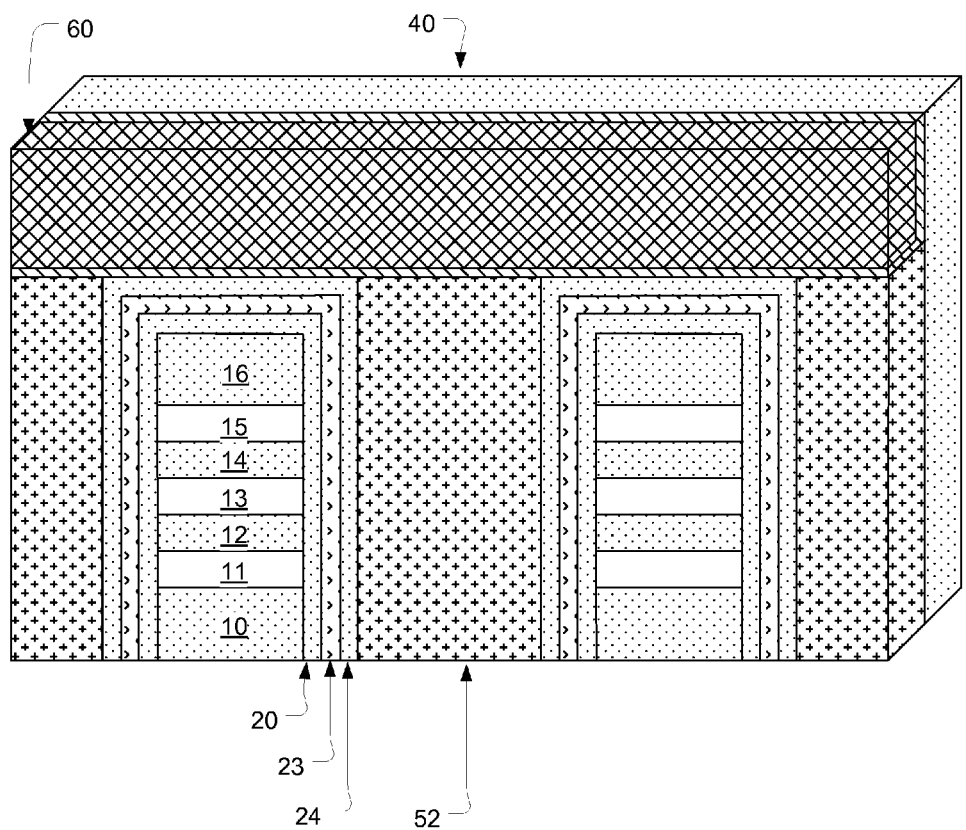
FIG. 16 is an alternative of FIG. 14, illustrating part of a process for manufacturing a memory device, and is a perspective illustration of forming word lines with metal surfaces on the exposed outer oxide of the oxide-nitride-oxide data storage layers and on the exposed polysilicon of FIG. 15.

FIG. 16 is an alternative of FIG. 14, illustrating part of a process for manufacturing a memory device, and is a perspective illustration of forming word lines with metal surfaces 60 on the exposed outer oxide of the oxide-nitride-oxide data storage layers and on the exposed polysilicon of FIG. 15.

TiN is deposited conformally, followed by W deposition and removal of excess material, such as by etching or CMP.

Figure 17:
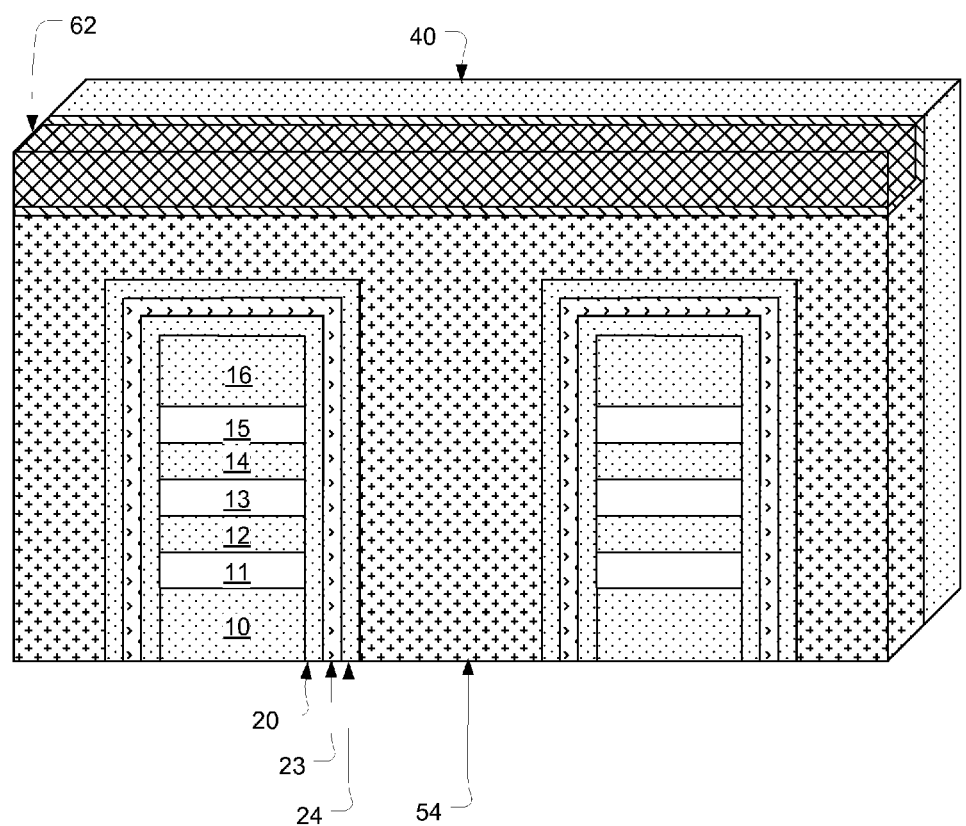
FIG. 17 is an alternative of FIG. 16, illustrating part of a process for manufacturing a memory device, and is a perspective illustration of forming word lines with metal surfaces on exposed polysilicon.

FIG. 17 is an alternative of FIG. 16, illustrating part of a process for manufacturing a memory device, and is a perspective illustration of forming word lines with metal surfaces on exposed polysilicon.

Unlike FIG. 16, following the polysilicon etch, a horizontal polysilicon member is left that connects the vertical polysilicon members on the sides of the plurality of ridges.

The metal is deposited on the exposed horizontal polysilicon member. More particularly, TiN is deposited conformally, followed by W deposition and removal of excess material, such as by etching or CMP.

Figure 18:
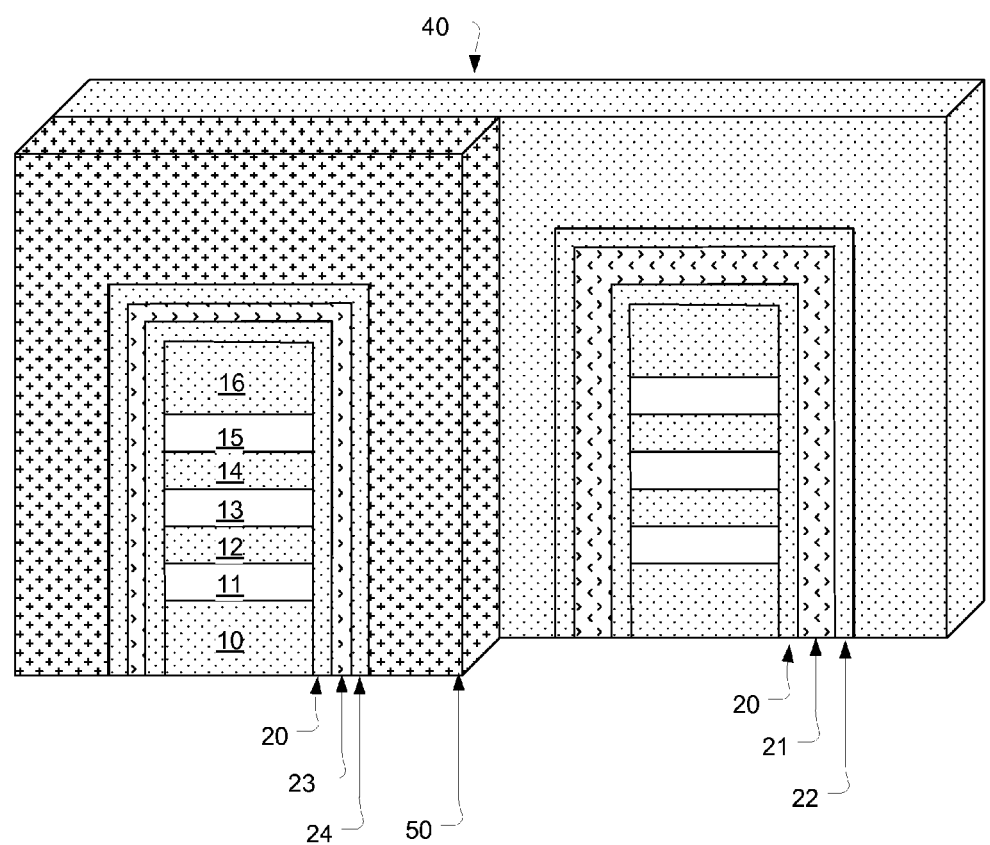
FIG. 18 is a perspective view comparing the nitride layer of the oxide-nitride-oxide data storage layers, between the areas under the word lines and the areas under the oxide lines.

FIG. 18 is a perspective view comparing the nitride layer of the oxide-nitride-oxide data storage layers, between the areas under the word lines and the areas under the oxide lines.

The nitride layer 23 for the kernel area, or the region under a word line 50, is thinner than the nitride layer 21 for the region under an oxide line 40. The thinner nitride layer 23 results from oxidation of part of the nitride layer 21 as discussed in connection with FIG. 12. The thicker nitride layer 21 under the oxide line 40 helps reduce unwanted operations due to fringing electric fields.

Figure 19:
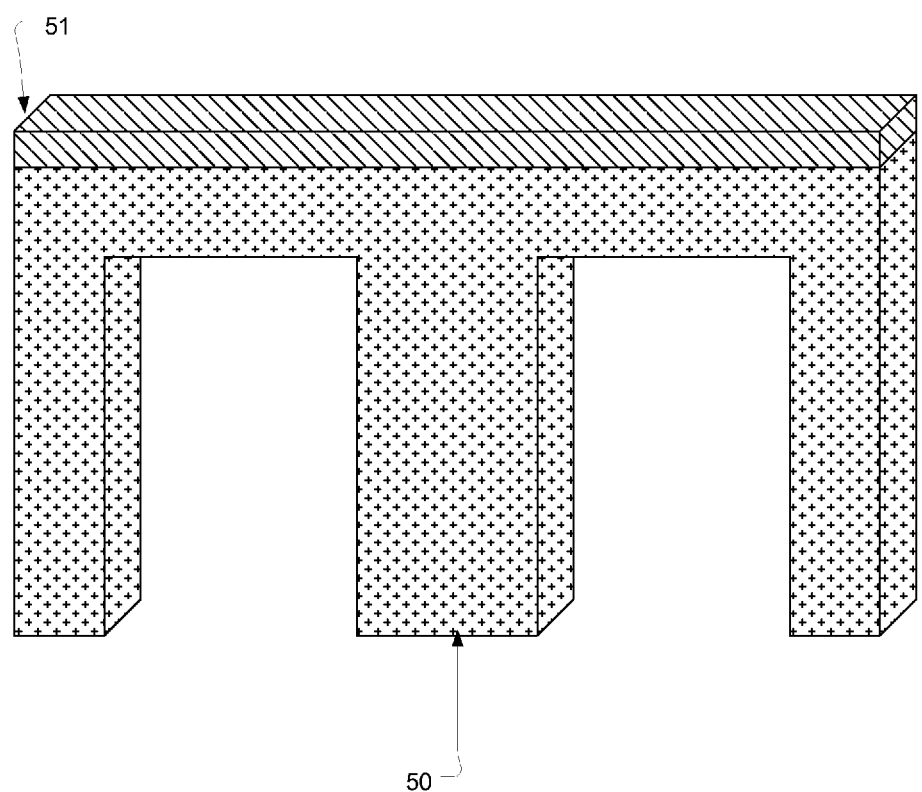
FIGS. 19-21 are perspective views of various "M"-shaped gates.
Figure 20:
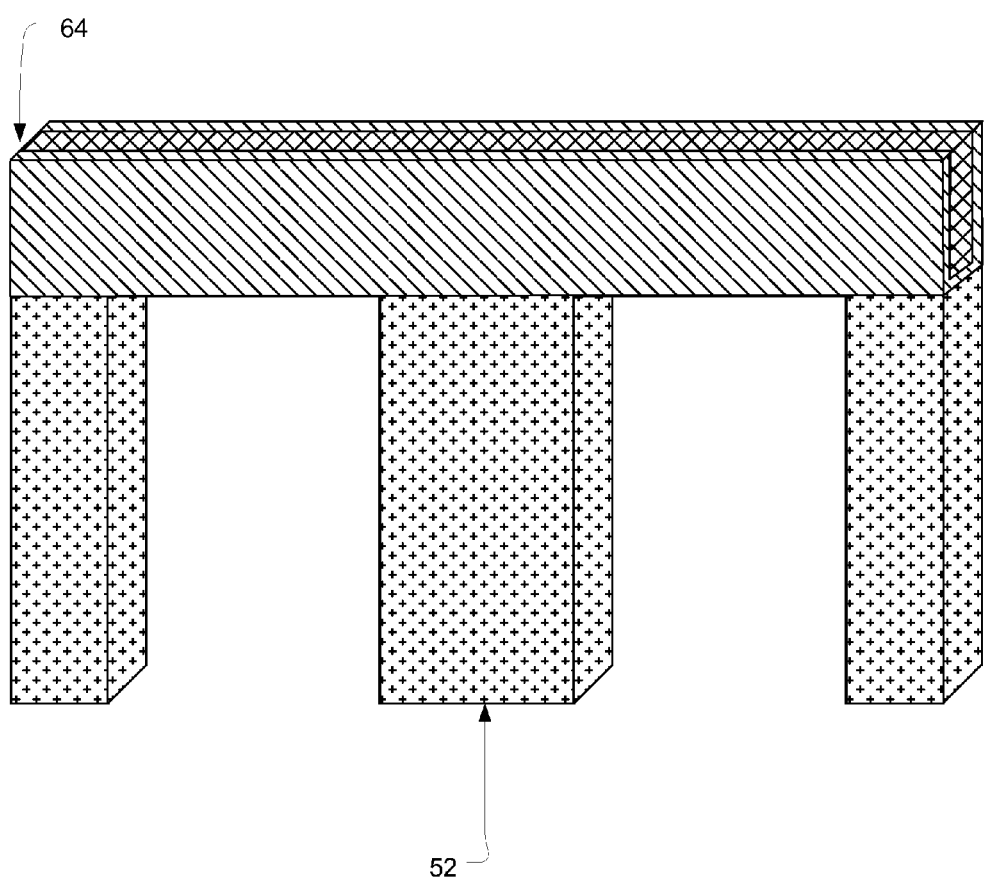
Figure 21:
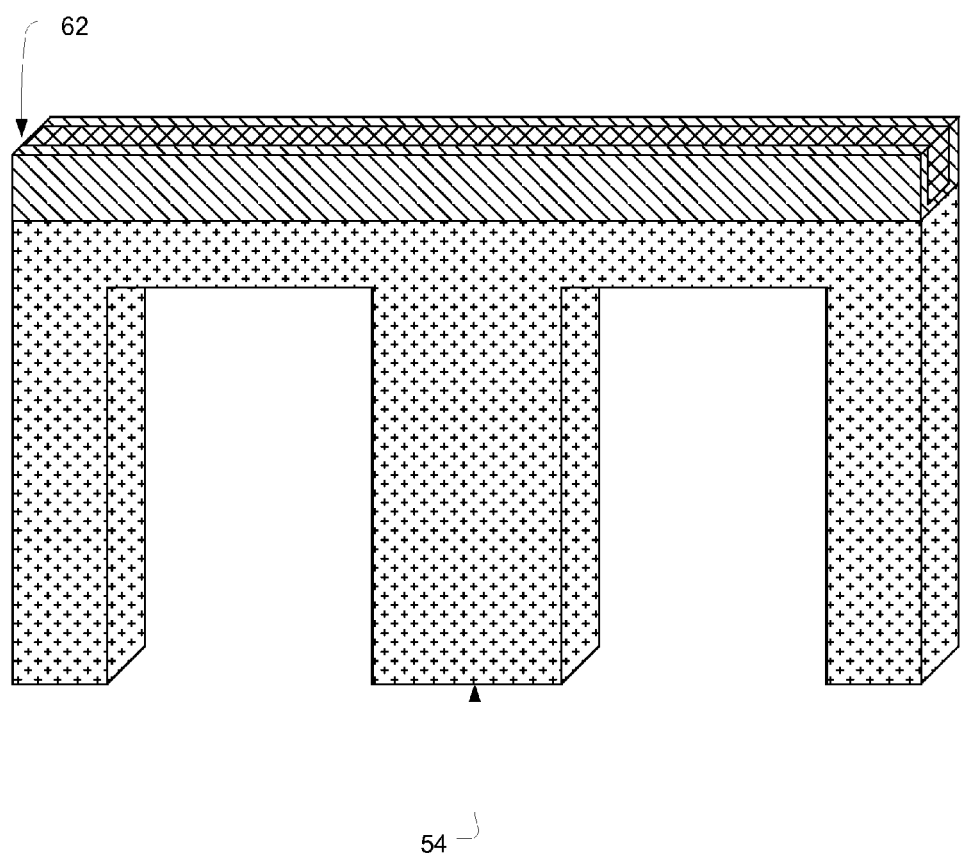

FIGS. 19-21 are perspective views of various "M"-shaped gates. FIG. 19 shows the "M"-shaped gate from FIG. 14. FIG. 20 shows the "M"-shaped gate from FIG. 16. FIG. 21 shows the "M"-shaped gate from FIG. 17. In FIGS. 20 and 21, the proximal surfaces of the respective metal lines 64 and 62 are covered with the conformal liner such as TiN. In contrast, in FIGS. 19 and 16 the proximal surfaces of the respective metal lines 64 and 62 were shown uncovered by the conformal liner such as TiN for illustration purposes.

FIG. 22 is a picture of a cross-section of part of a 3D memory with a stack of alternating channels and oxides, illustrating areas of potential "shadow effect".

The TEM cross-section shows a portion of an 8-layer vertical gate, thin-film-transistor, BE-SONOS charge trapping NAND device which has been fabricated and tested. The device was made with a 75 nm half pitch. The channels were n-type polysilicon about 18 nm thick. Two polysilicon channels are shown, with a surrounding structure of O1/N1/O2; N2; and O3 about 17 nm thick. No additional junction implant was used, resulting in a junction free structure. The insulating material between the strips to isolate the channels in the Z-direction was silicon dioxide was about 40 nm thick. The gates were provided by a p+-polysilicon line, shown in the figure as "P+-poly gate". The test device implemented 32 word line, junction-free NAND strings. The width of the lower strip is greater than the width of the upper strip because the trench etch used to form the structure resulted in a tapered side wall with progressively wider strips as the trench becomes deeper, and with the insulating material between the strips being etched more than the polysilicon. The narrower width of the insulating material, and the broader width of the adjacent channels, results in a surrounding gate effect that benefits device control and performance. However, another result is the potential shadow effect areas which induce unwanted polysilicon residues in the shadow effect areas, shown in the figure as "area at risk of shadow effect". Fortunately, in various disclosed embodiments, such polysilicon residues are oxidized so that the polysilicon residues do not remain and create undesirable electrical connection between neighboring word lines.

Figure 23:
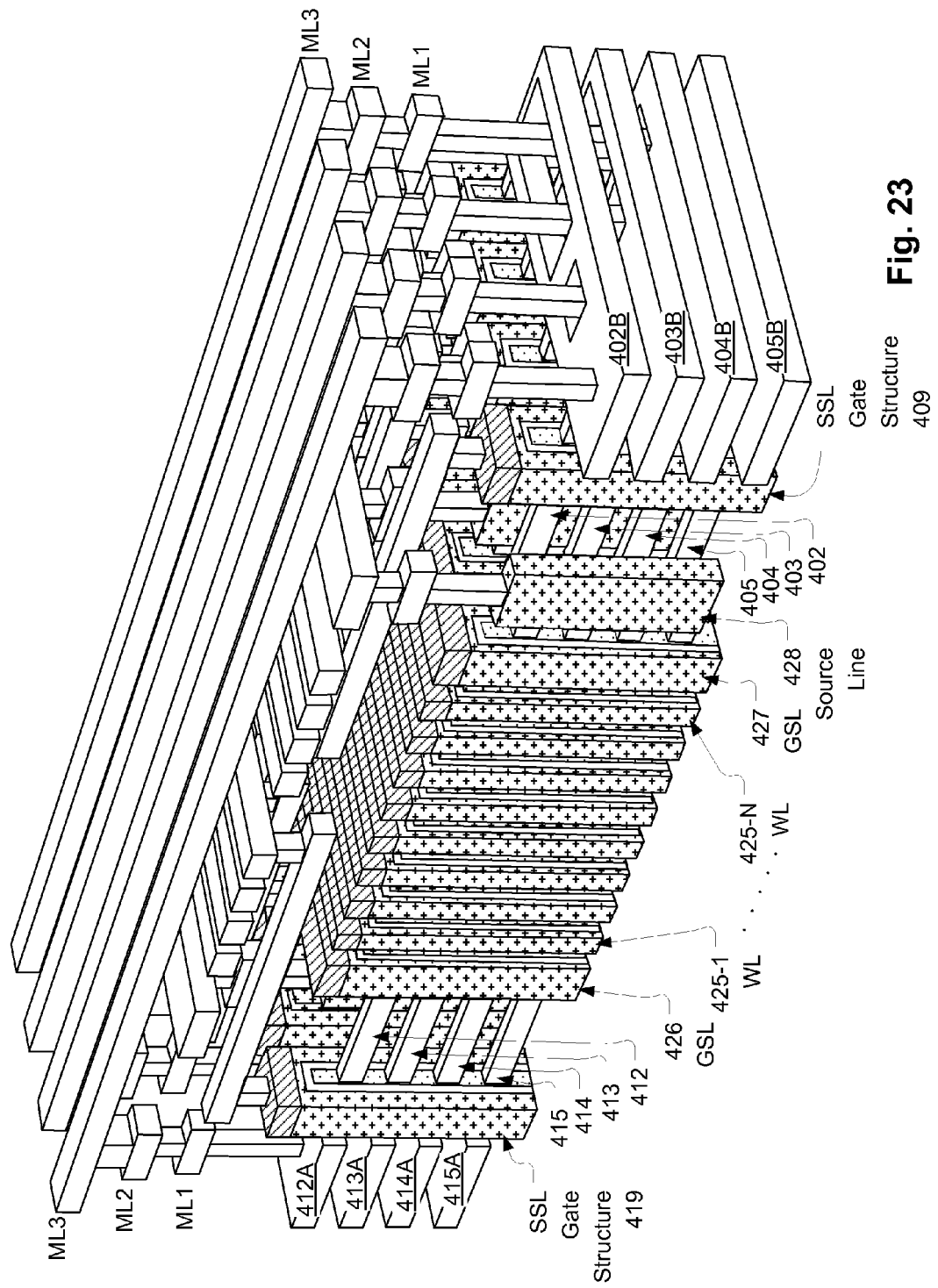
FIG. 23 is an example 3D memory structure with the damascene gate.

FIG. 23 is an example 3D memory structure with the damascene gate. A 3D NAND-flash memory array structure has metal layers of string select lines (a lengthwise orientation layer parallel to the semiconductor material strips, a widthwise orientation layer parallel to the word lines) and bit lines with a lengthwise orientation parallel to the semiconductor material strips. Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of word lines 425-1, . . . , 425-n-1, 425-n conformal with the plurality of ridge-shaped stacks, and which act as word lines WLn, WLn-1, . . . WL1. The damascene wod lines ar discussed herein. The plurality of ridge-shaped stacks includes semiconductor strips 412, 413, 414, 415. Semiconductor strips in the same plane are electrically coupled together by stairstep structures.

The shown word line numbering, ascending from 1 to N going from the back to the front of the overall structure, applies to even memory pages. For odd memory pages, the word line numbering descends from N to 1 going from the back to the front of the overall structure.

Stairstep structures 412A, 413A, 414A, 415A terminate semiconductor strips, such as semiconductor strips 412, 413, 414, 415. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B terminate semiconductor strips, such as semiconductor strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of semiconductor strips is coupled to either the stairstep structures 412A, 413A, 414A, 415A, or the stairstep structures 402B, 403B, 404B, 405B, but not both. A stack of semiconductor strips has one of the two opposite orientations of bit line end-to-source line end orientation, or source line end-to-bit line end orientation. For example, the stack of semiconductor strips 412, 413, 414, 415 has bit line end-to-source line end orientation; and the stack of semiconductor strips 402, 403, 404, 405 has source line end-to-bit line end orientation.

The stack of semiconductor strips 412, 413, 414, 415 is terminated at one end by the stairstep structures 412A, 413A, 414A, 415A, passes through SSL gate structure 419, gate select line GSL 426, word lines 425-1 WL through 425-N WL, gate select line GSL 427, and terminated at the other end by source line 428. The stack of semiconductor strips 412, 413, 414, 415 does not reach the stairstep structures 402B, 403B, 404B, 405B.

The stack of semiconductor strips 402, 403, 404, 405 is terminated at one end by the stairstep structures 402B, 403B, 404B, 405B, passes through SSL gate structure 409, gate select line GSL 427, word lines 425-N WL through 425-1 WL, gate select line GSL 426, and terminated at the other end by a source line (obscured by other parts of figure). The stack of semiconductor strips 402, 403, 404, 405 does not reach the stairstep structures 412A, 413A, 414A, 415A.

A layer of memory material separates the word lines 425-1 through 425-n, from the semiconductor strips 412-415 and 402-405 as described in detail in prior figures. Ground select lines GSL 426 and GSL 427 are conformal with the plurality of ridge-shaped stacks, similar to the word lines.

Every stack of semiconductor strips is terminated at one end by stairstep structures, and at the other end by a source line. For example, the stack of semiconductor strips 412, 413, 414, 415 is terminated at one end by stairstep structures 412A, 413A, 414A, 415A, and terminated on the other end by source line 428. At the near end of the figure, every other stack of semiconductor strips is terminated by the stairstep structures 402B, 403B, 404B, 405B; and every other stack of semiconductor strips is terminated by a separate source line. At the far end of the figure, every other stack of semiconductor strips is terminated by the stairstep structures 412A, 413A, 414A, 415A,; and every other stack of semiconductor strips is terminated by a separate source line.

Bit lines and string select lines are formed at the metals layers ML1, ML2, and ML3.

Transistors are formed between the stairstep structures 412A, 413A, 414A and the word line 425-1. In the transistors, the semiconductor strip (e.g. 413) acts as the channel region of the device. SSL gate structures (e.g. 419, 409) are patterned during the same step that the word lines 425-1 through 425-n are defined. A layer of silicide can be formed along the top surface of the word lines 425-1 through 425-n, the ground select lines 426 and 427, and over the gate structures 409 and 419. The layer of memory material 415 can act as the gate dielectric for the transistors. These transistors act as string select gates coupled to decoding circuitry for selecting particular ridge-shaped stacks in the array.

The first metal layer ML1 includes string select lines with a lengthwise orientation parallel to the semiconductor material strips. These ML1 string select lines are connected by short vias to different SSL gate structures.

The second metal layer ML2 includes string select lines with a widthwise orientation parallel to the word lines. These ML2 string select lines are connected by short vias to different ML1 string select lines.

In combination, these ML1 string select lines and ML2 string select lines allow a string select line signal to select a particular stack of semiconductor strips.

The first metal layer ML1 also includes two source lines with a widthwise orientation parallel to the word lines.

Finally, the third metal layer ML3 includes bit lines with a lengthwise orientation parallel to the semiconductor material strips. Different bit lines are electrically connected to different steps of the stairstep structures 412A, 413A, 414A, 415A and 402B, 403B, 404B, 405B. These ML3 bit lines allow a bit line signal to select a particular horizontal plane of semiconductor strips.

Because a particular word line allows a word line to select a particular row plane of memory cells, the threefold combination of word line signals, bit line signals, and string select line signals is sufficient to select a particular memory cell from the 3D array of memory cells.

Figure 24:
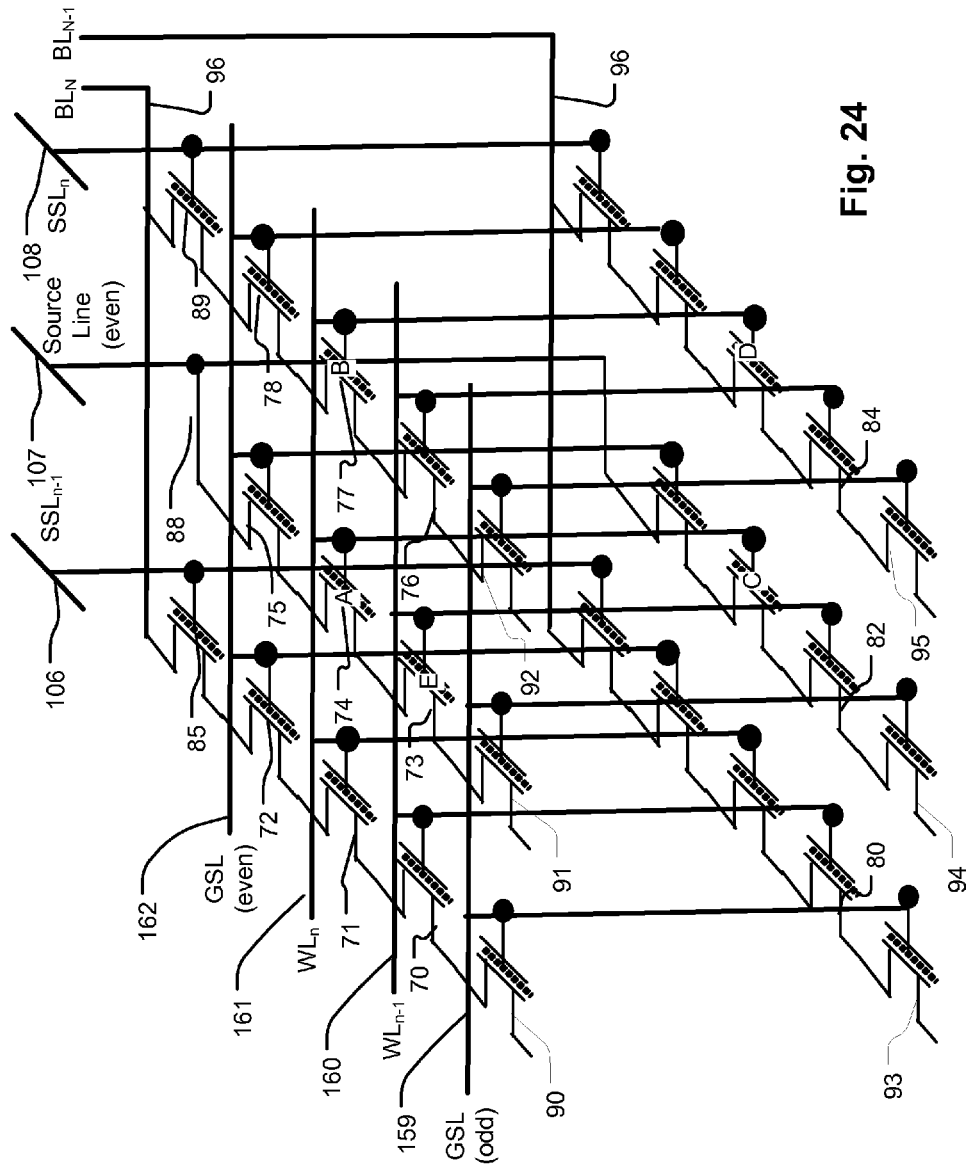
FIG. 24 is a circuit diagram corresponding to the example 3D memory structure of FIG. 23 with the damascene gate.

FIG. 24 is a circuit diagram corresponding to the example 3D memory structure of FIG. 23 with the damascene gate.

The schematic diagram shows 2 planes of memory cells having 9 charge trapping cells arranged in a NAND configuration, which is representative of a cube which can include many planes and many word lines. The 2 planes of memory cells are defined at the cross-points of word lines 160, 161 acting as word lines WLn-1, WLn, with a first stack of semiconductor strips, a second stack of semiconductor strips and a third stack of semiconductor strips.

The first plane of memory cells includes memory cells 70, 71 in a NAND string on a semiconductor strip, memory cells 73, 74 in a NAND string on a semiconductor strip, and memory cells 76, 77 in a NAND string on a semiconductor strip. Each NAND string is connected to a ground select transistor on either side (e.g., ground select devices 90, 72 on either side of NAND string 70, 71).

The second plane of memory cells corresponds with a bottom plane in the cube in this example, and includes memory cells (e.g. 80, 82, 84) arranged in NAND strings in a similar manner those in the first plane.

As shown in the figure, the word line 161 acting as word line WLn includes vertical extensions which correspond with the material in the trench 120 shown in FIG. 5 between the stacks, in order to couple the word line 161 to the memory cells (cells 71, 74, 77 in the first plane) in the interface regions in the trenches between the semiconductor strips in all of the planes.

Memory cell strings in adjacent stacks alternate between a bit line end-to-source line end orientation and a source line end-to-bit line end orientation.

Bit lines $BL_N$ and $BL_{N-1}$ 96 terminate the memory cell strings, adjacent to the string select devices. For example, in the top memory plane, bit line $BL_N$ terminates the memory cell strings which have string select transistors 85 and 89. By contrast, the bit line is not connected to trace 88, because the strings of adjacent stacks alternate between a bit line end-to-source line end orientation and a source line end-to-bit line end orientation. So instead for this string, the corresponding bit line is connected to the other end of the string. In the bottom memory plane, bit line $BL_{N-1}$ terminates the memory cell strings which have corresponding string select transistors.

String select transistors 85, 89 are connected between respective NAND strings and string select lines $SSL_{n-1}$ and $SSL_n$ in this arrangement. Likewise, similar string select transistors on a bottom plane in the cube are connected between respective NAND strings and string select lines $SSL_{n-1}$ and $SSL_n$ in this arrangement. String select lines 106, 108, are connected to different ridges, to the gates of string select transistors in each memory cell string, and provide in this example string select signal $SSL_{n-1}$, $SSL_n$ and $SSL_{n+1}$.

By contrast, a string select transistor is not connected to trace 88, because the strings of adjacent stacks alternate between a bit line end-to-source line end orientation and a source line end-to-bit line end orientation. So instead for this string, the corresponding string select transistor is connected to the other end of the string. The NAND string with memory cells 73, 74 also has a string select device, not shown, on the other end of the string. The trace 88 is terminated by a source line 107.

Ground select transistors 90-95 are arranged at the first ends of the NAND strings. Ground select transistors 72, 75, 78 and corresponding second plane ground select transistors are arranged at the second ends of the NAND strings. Accordingly, ground select transistors are on both ends of the memory strings. Depending on the particular end of the memory string, the ground select transistor couples the memory string to a source line, or to a string select device and bit line.

The ground select signal GSL (odd) 159 and ground select signal GSL (even) 162 are on opposite sides of the word lines 160, 161 acting as word lines WLn-1, WLn. The ground select signal GSL (odd) 159 in this example is coupled to the gates of the ground select transistors 90-95, and can be implemented in the same manner as the word lines 160, 161. Similarly, the ground select signal GSL (even) 162 in this example is coupled to the gates of ground select transistors 72, 75, 78 and corresponding second plane ground select transistors, and can be implemented in the same manner as the word lines 160, 161. The string select transistors and ground select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Transistors A, B, and E are in the top plane of memory cells. Transistors C and D are in the bottom plane of memory cells. Transistors A, C, and E are in strings coupled to source line 107. Transistors B and D are in strings coupled to source line 108. Transistors A, B, C, and D are coupled to word line 161. Transistor E is coupled to word line 160.

Figure 25:
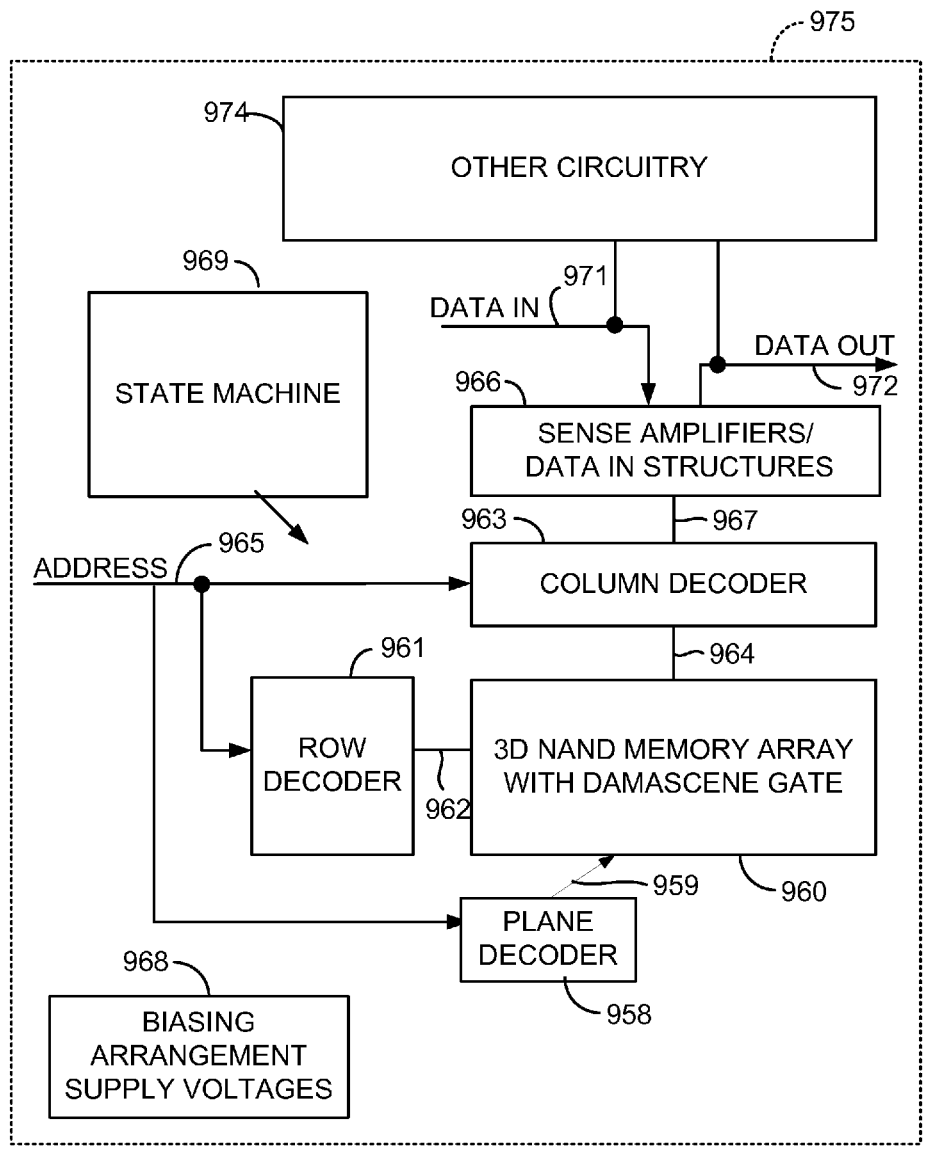
FIG. 25 is a schematic diagram of an integrated circuit including a 3D NAND-flash memory array with the damascene gate and row, column and plane decoding circuitry.

FIG. 25 is a schematic diagram of an integrated circuit including a 3D NAND-flash memory array with the damascene gate and row, column and plane decoding circuitry.

The integrated circuit line 975 includes a 3D NAND flash memory array 960, implemented as described herein, with a damascene gate or word line. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of making a three dimensional array of nonvolatile memory cells, comprising:
   making a plurality of word line trenches over a plurality of stacked nonvolatile memory structures in the three dimensional array, by removing unoxidized silicon material and consequently forming a plurality of silicon lines including the unoxidized silicon material over the plurality of stacked nonvolatile memory structures such that the plurality of word line trenches separate neighboring ones of the plurality of silicon lines, wherein word line trenches in the plurality of word line trenches and silicon lines in the plurality of silicon lines run along a same direction; then
   making insulating surfaces in the plurality of word line trenches and in contact with the plurality of stacked nonvolatile memory structures, by oxidizing the plurality of silicon lines separated by the plurality of word line trenches; and then
   making a plurality of word lines in the plurality of word line trenches.

2. The method of claim 1, wherein forming the plurality of silicon lines leaves silicon residue in at least one word line trench of the plurality of word line trenches, and the silicon residue is oxidized, while oxidizing the plurality of silicon lines.

3. The method of claim 1, wherein the plurality of silicon lines have voids, and the voids are filled with oxidized silicon, while oxidizing the plurality of silicon lines.

4. The method of claim 1, wherein forming the plurality of silicon lines includes making a layer of silicon over the plurality of stacked nonvolatile memory structures, and removing excess silicon from the layer to leave the plurality of silicon lines and form the plurality of word line trenches between neighboring ones of the plurality of silicon lines.

5. The method of claim 1, further comprising:
   after oxidizing the plurality of silicon lines, etching exposed oxide covering the plurality of stacked nonvolatile memory structures in the plurality of word line trenches; and then
   forming oxide covering the plurality of stacked nonvolatile memory structures in the plurality of word line trenches.

6. The method of claim 1, further comprising:
   after oxidizing the plurality of silicon lines, etching exposed oxide covering the plurality of stacked nonvolatile memory structures in the plurality of word line trenches, until exposing a nitride layer covering the plurality of stacked nonvolatile memory structures.

7. The method of claim 1, further comprising:
   after oxidizing the plurality of silicon lines, etching exposed oxide covering the plurality of stacked nonvolatile memory structures in the plurality of word line trenches, until exposing a nitride layer of the plurality of stacked nonvolatile memory structures; and
   oxidizing the nitride layer covering the plurality of stacked nonvolatile memory structures to form an outer oxide covering the plurality of stacked nonvolatile memory structures in the plurality of word line trenches.

8. The method of claim 1, wherein making the plurality of word lines is a damascene process.

9. The method of claim 1, further comprising:
   prior to making the plurality of word line trenches, forming the plurality of stacked nonvolatile memory structures including a plurality of semiconductor strips separated by insulating material, and charge storage structures covering the plurality of semiconductor strips, the charge storage structures including a hafnium oxide layer.

10. The method of claim 1, further comprising:
    prior to making the plurality of word line trenches, forming the plurality of stacked nonvolatile memory structures including a plurality of semiconductor strips separated by insulating material, and charge storage structures covering the plurality of semiconductor strips, the charge storage structures including a dielectric layer having a dielectric constant greater than a silicon oxide dielectric constant.

11. A method of making word lines in a three dimensional array of nonvolatile memory cells, comprising:
    making a plurality of word line trenches over a plurality of stacked nonvolatile memory structures in the three dimensional array, by removing unoxidized material and consequently forming a plurality of material lines including the unoxidized material over the plurality of stacked nonvolatile memory structures such that the plurality of word line trenches separate neighboring ones of the plurality of material lines, wherein word line trenches in the plurality of word line trenches and material lines in the plurality of material lines run along a same direction; then
    making insulating surfaces in the plurality of word line trenches and in contact with the plurality of stacked nonvolatile memory structures, by oxidizing the plurality of material lines separated by the plurality of word line trenches; and then
    making a plurality of word lines in the plurality of word line trenches.

12. The method of claim 11, wherein the plurality of material lines include metal lines.

13. A method of making a three dimensional array of nonvolatile memory cells, comprising:
    making a plurality of word lines in a plurality of word line trenches over a plurality of stacked nonvolatile memory structures in the three dimensional array, the plurality of word line trenches separating neighboring ones of a plurality of oxide lines over the plurality of stacked nonvolatile memory structures, the plurality of word lines including a first set of silicon members between neighboring stacks of the plurality of stacked nonvolatile memory structures,
    wherein making the plurality of word lines comprises:
    filling the plurality of word line trenches with a plurality of silicon word lines;
    etching part of the plurality of silicon word lines to make metal trenches in the plurality of silicon word lines; and
    filling the metal trenches with metal to form metal surfaces of the plurality of silicon word lines.

14. The method of claim 13,
    wherein
    said etching part of the plurality of silicon word lines to make metal trenches in the plurality of silicon word lines, exposes charge storage structures covering the plurality of stacked nonvolatile memory structures.

15. The method of claim 13,
    wherein
    said etching part of the plurality of silicon word lines to make metal trenches in the plurality of silicon word lines, is performed without exposing charge storage structures covering the plurality of stacked nonvolatile memory structures.

* * * * *